(12) United States Patent
Park et al.

(10) Patent No.: US 12,245,512 B2
(45) Date of Patent: Mar. 4, 2025

(54) LOW-VOLTAGE SOFT ACTUATOR CAPABLE OF LINEAR MOTION IN AIR

(71) Applicant: POSTECH ACADEMY-INDUSTRY FOUNDATION, Pohang-si (KR)

(72) Inventors: Moon Jeong Park, Pohang-si (KR); Hyeon Seong Ham, Seoul (KR); Dipankar Barpuazary, Pohang-si (KR)

(73) Assignee: POSTECH ACADEMY-INDUSTRY FOUNDATION, Pohang-si (KR)

( * ) Notice: Subject to any disclaimer, the term of this patent is extended or adjusted under 35 U.S.C. 154(b) by 714 days.

(21) Appl. No.: 17/532,053

(22) Filed: Nov. 22, 2021

(65) Prior Publication Data

US 2022/0199894 A1    Jun. 23, 2022

(30) Foreign Application Priority Data

Dec. 23, 2020    (KR) .......................... 10-2020-0181975

(51) Int. Cl.
| | | |
|---|---|---|
| *H01L 41/047* | (2006.01) | |
| *H10N 30/20* | (2023.01) | |
| *H10N 30/857* | (2023.01) | |
| *H10N 30/87* | (2023.01) | |

(52) U.S. Cl.
CPC ....... *H10N 30/857* (2023.02); *H10N 30/2023* (2023.02); *H10N 30/871* (2023.02)

(58) Field of Classification Search
CPC .......................... H10N 30/2023; H10N 30/857
USPC .......................................................... 310/800
See application file for complete search history.

(56) References Cited

U.S. PATENT DOCUMENTS

| | | | |
|---|---|---|---|
| 7,315,106 B2 | 1/2008 | Asaka et al. | |
| 8,487,505 B2 | 7/2013 | Ikushima et al. | |
| 2010/0141085 A1* | 6/2010 | Wu ..................... | H01M 8/1067 977/773 |
| 2014/0150859 A1* | 6/2014 | Zakhidov ............. | H01G 9/2059 257/40 |

FOREIGN PATENT DOCUMENTS

| | | |
|---|---|---|
| JP | 2004162035 | 6/2004 |
| JP | 2004197069 | 7/2004 |
| JP | 2008-211916 | 9/2008 |
| JP | 2017-184586 | 10/2017 |
| KR | 10-2006-0052980 | 5/2006 |
| KR | 20140132538 | 11/2014 |
| KR | 10-2015-0022474 | 3/2015 |
| KR | 20180105062 | 9/2018 |
| WO | 2010100907 | 9/2010 |

* cited by examiner

Primary Examiner — Derek J Rosenau
(74) Attorney, Agent, or Firm — LEX IP MEISTER, PLLC

(57) ABSTRACT

The present invention relates to an actuator including: a first ionic polymer layer disposed on underside of a first electrode layer; a second ionic polymer layer disposed on top of a second electrode layer; and a porous conducting interlayer disposed between the first ionic polymer layer and the second ionic polymer layer.

22 Claims, 25 Drawing Sheets

[Fig. 1]
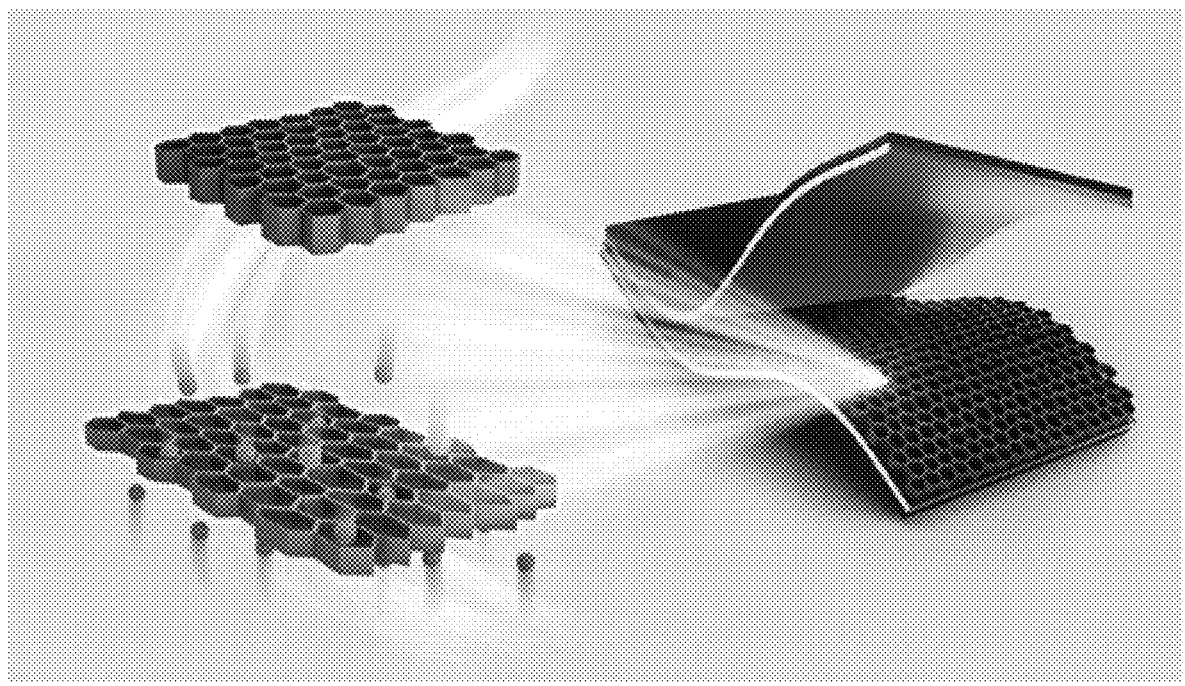

[Fig. 2a]
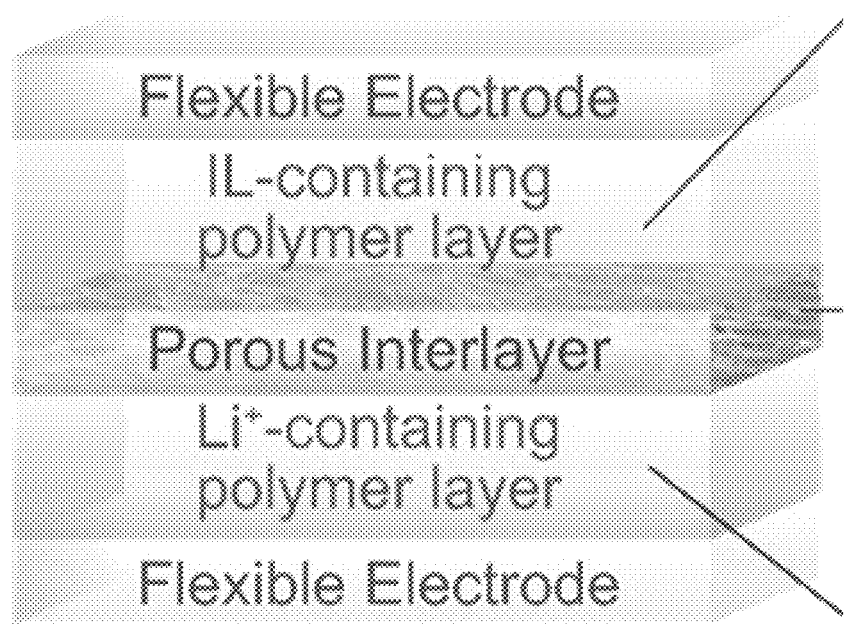

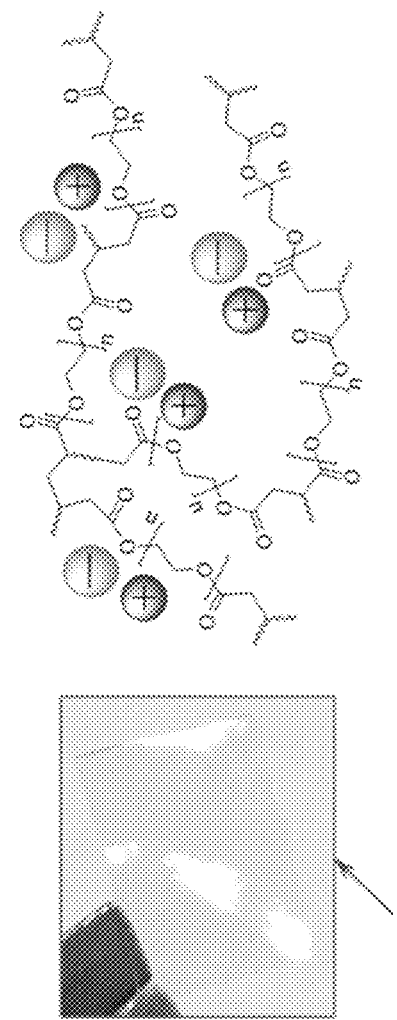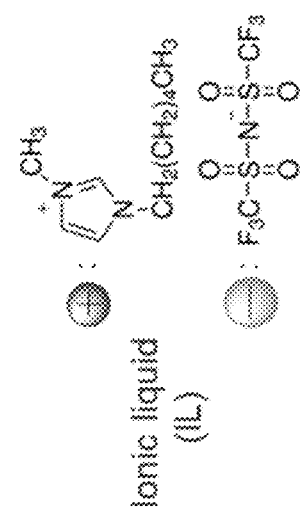
[Fig. 2b]

[Fig. 2c]
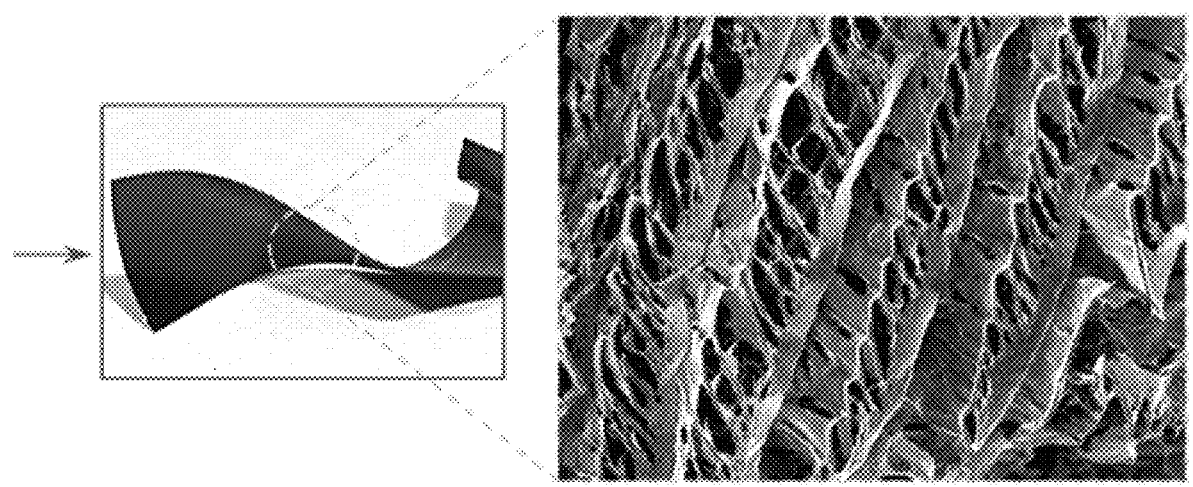

[Fig. 2d]
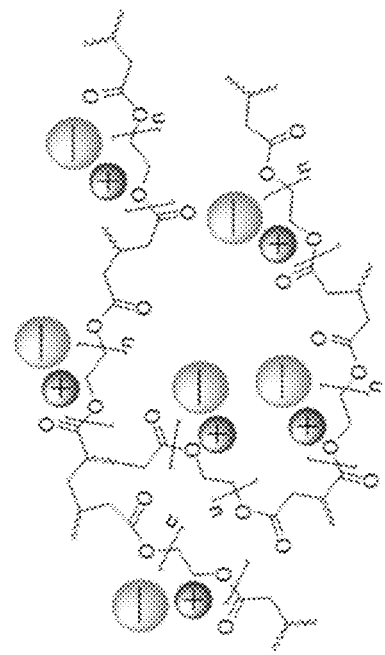
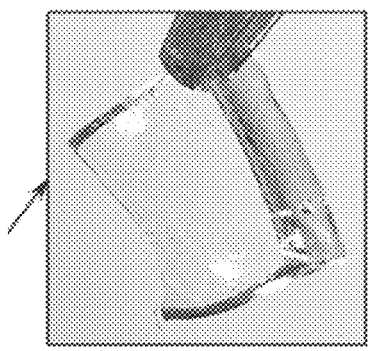
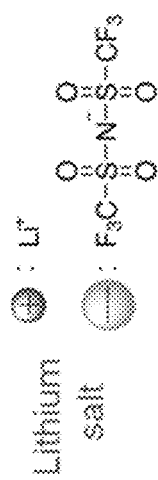

[Fig. 3]
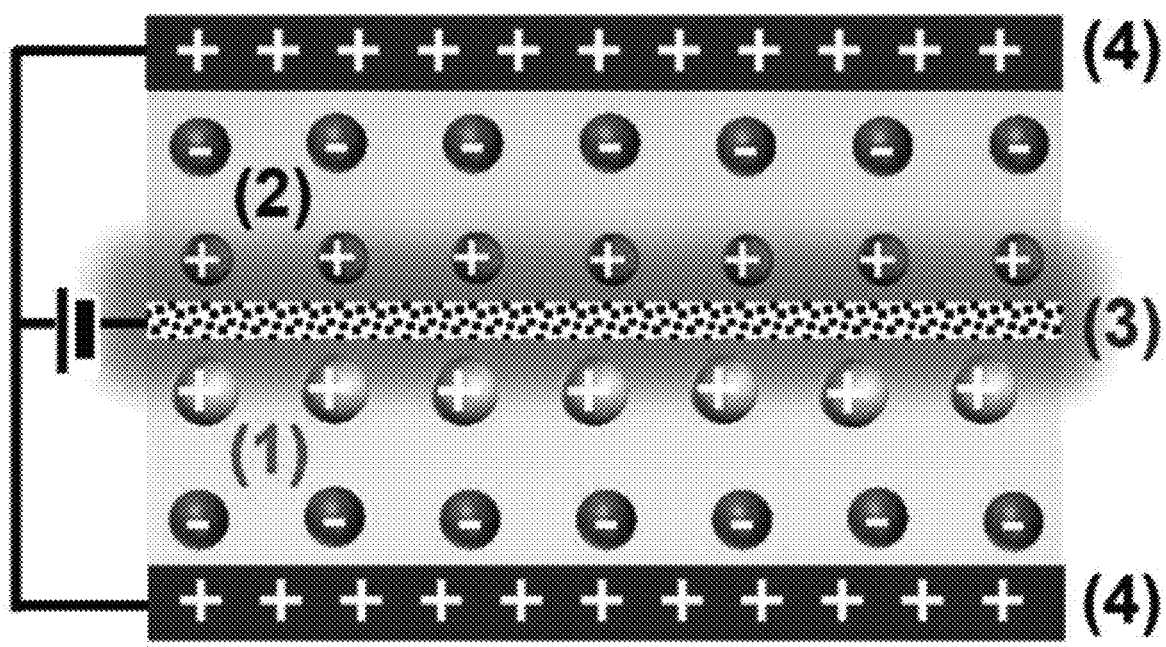

[Fig. 4]
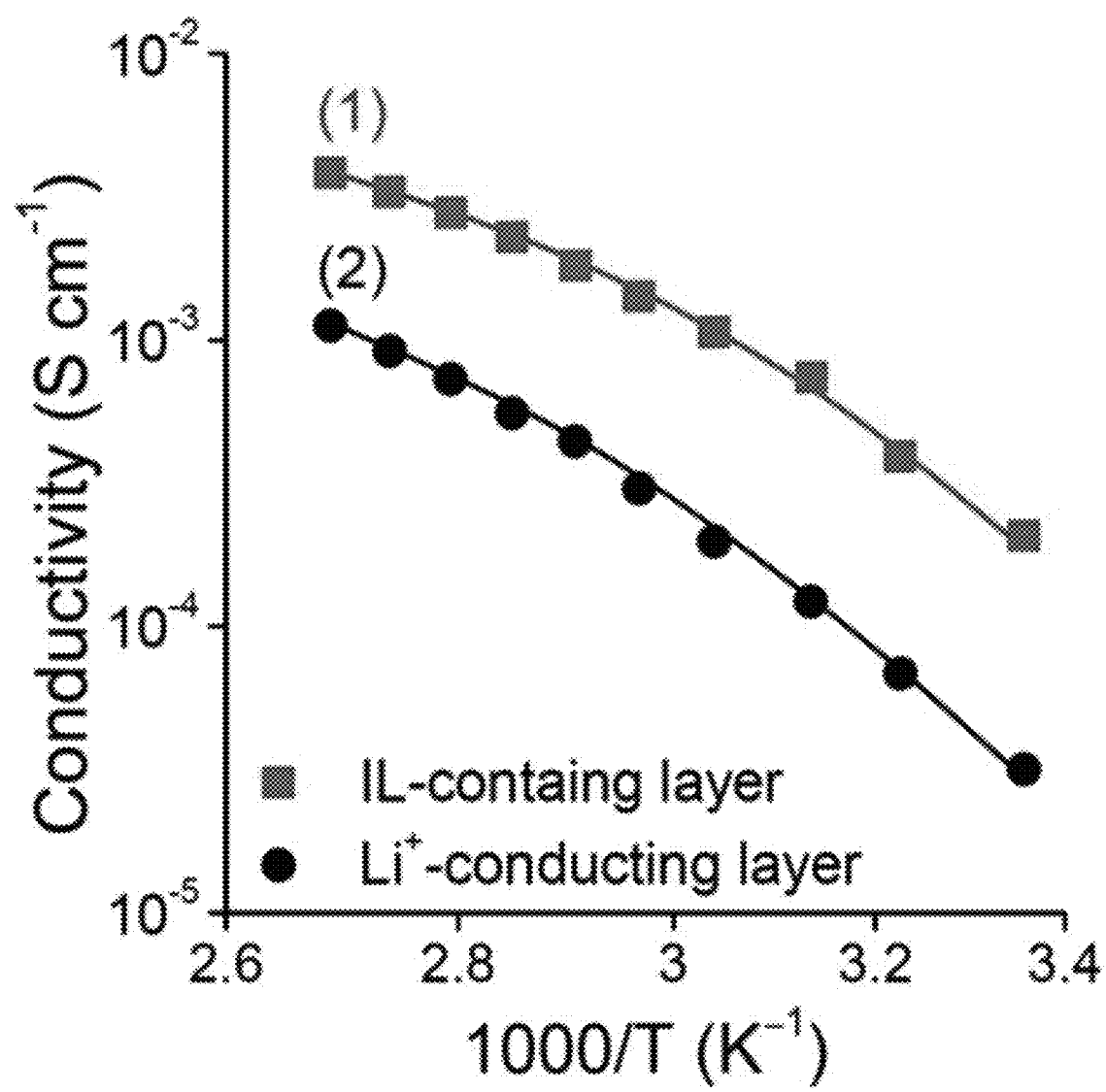

[Fig. 5]
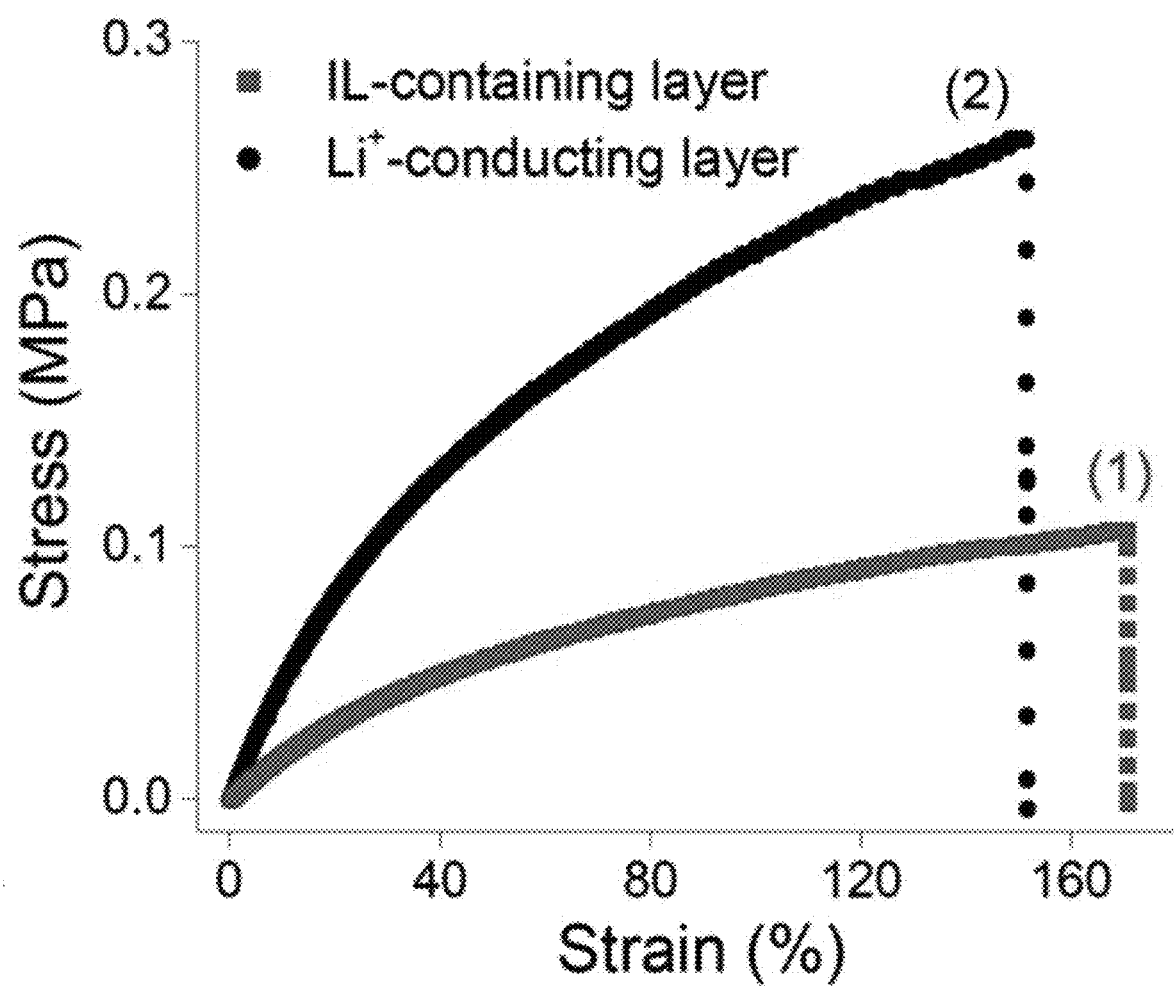

[Fig. 6]
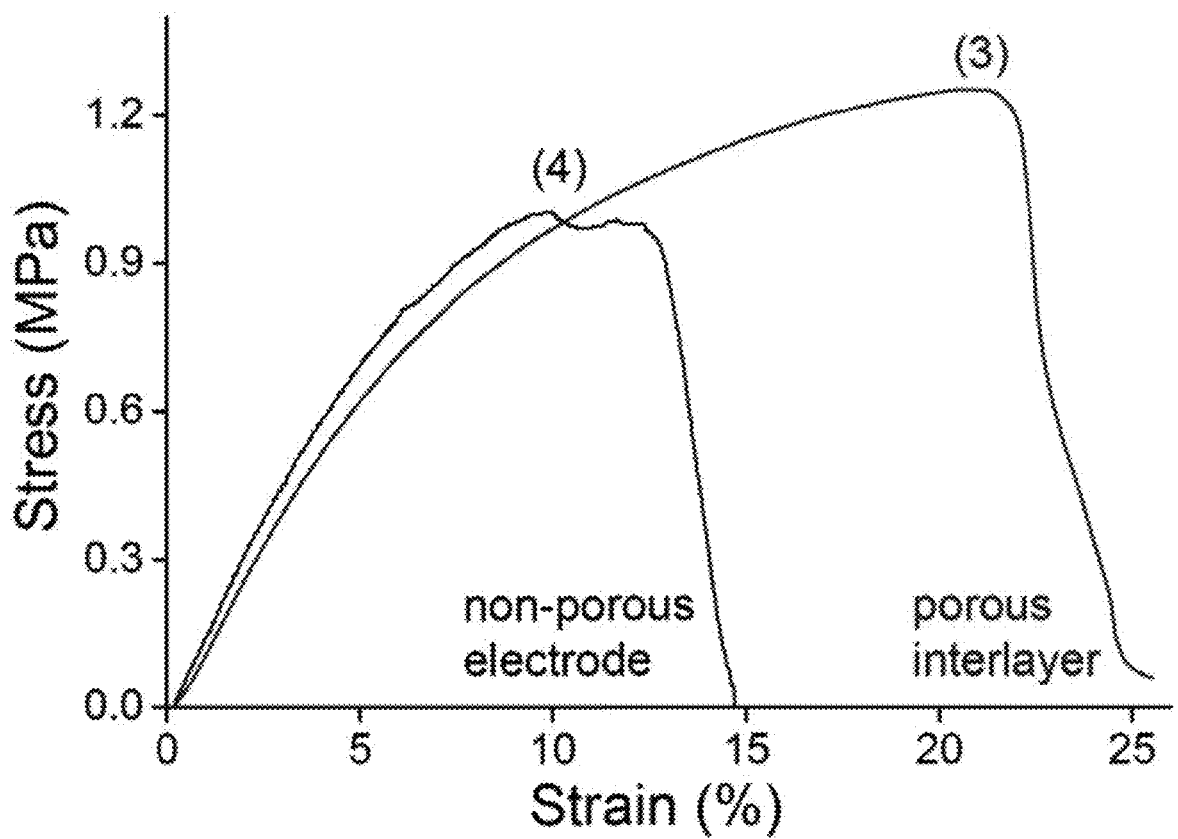

[Fig. 7]
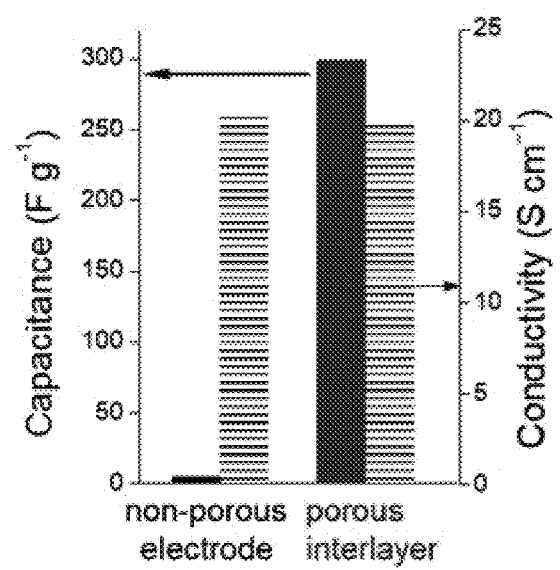

[Fig. 8]
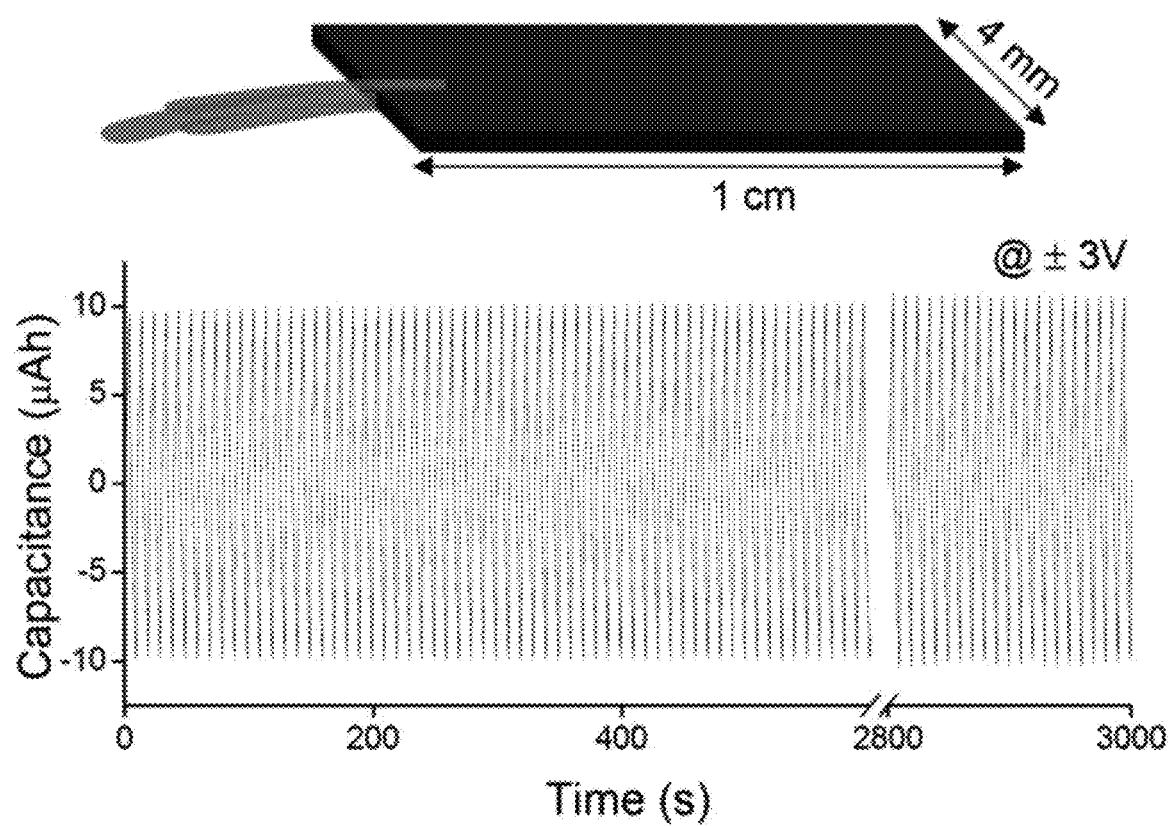

[Fig. 9]
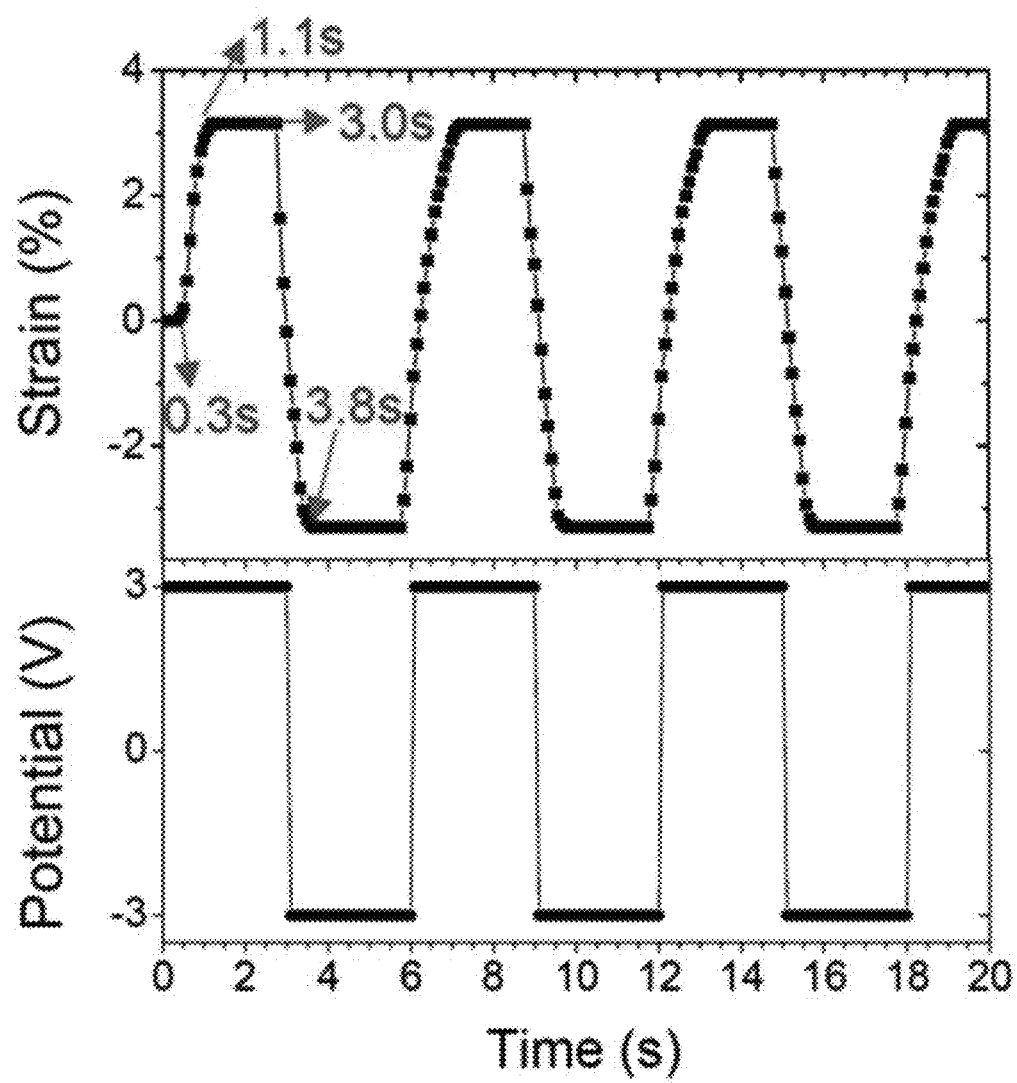

[Fig. 10]
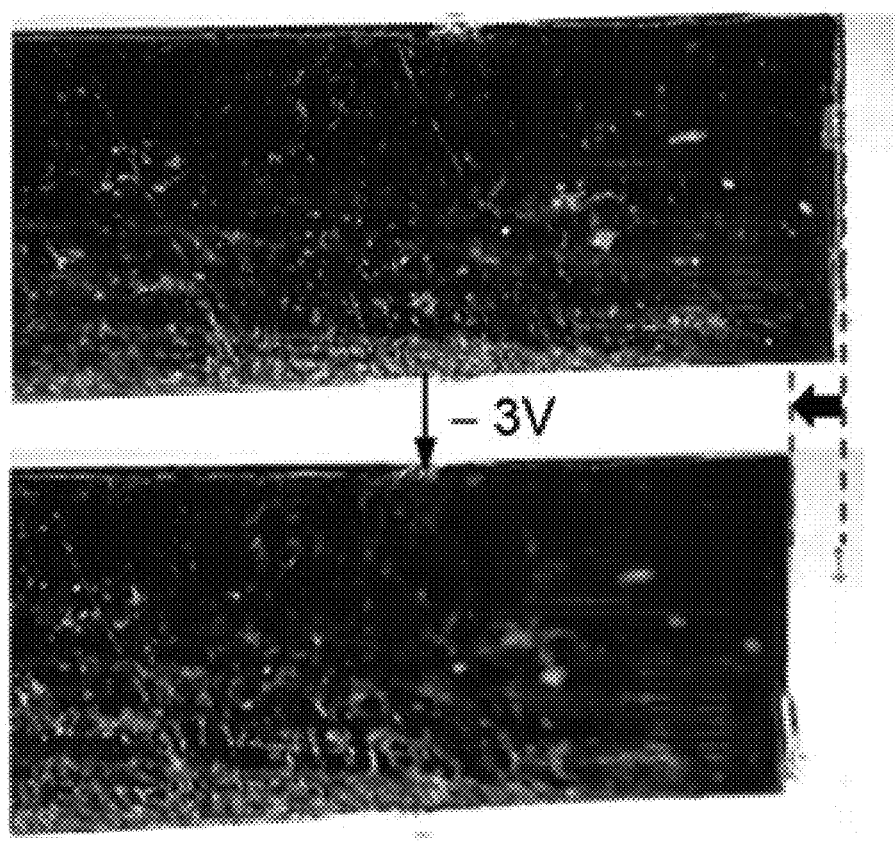

[Fig. 11]
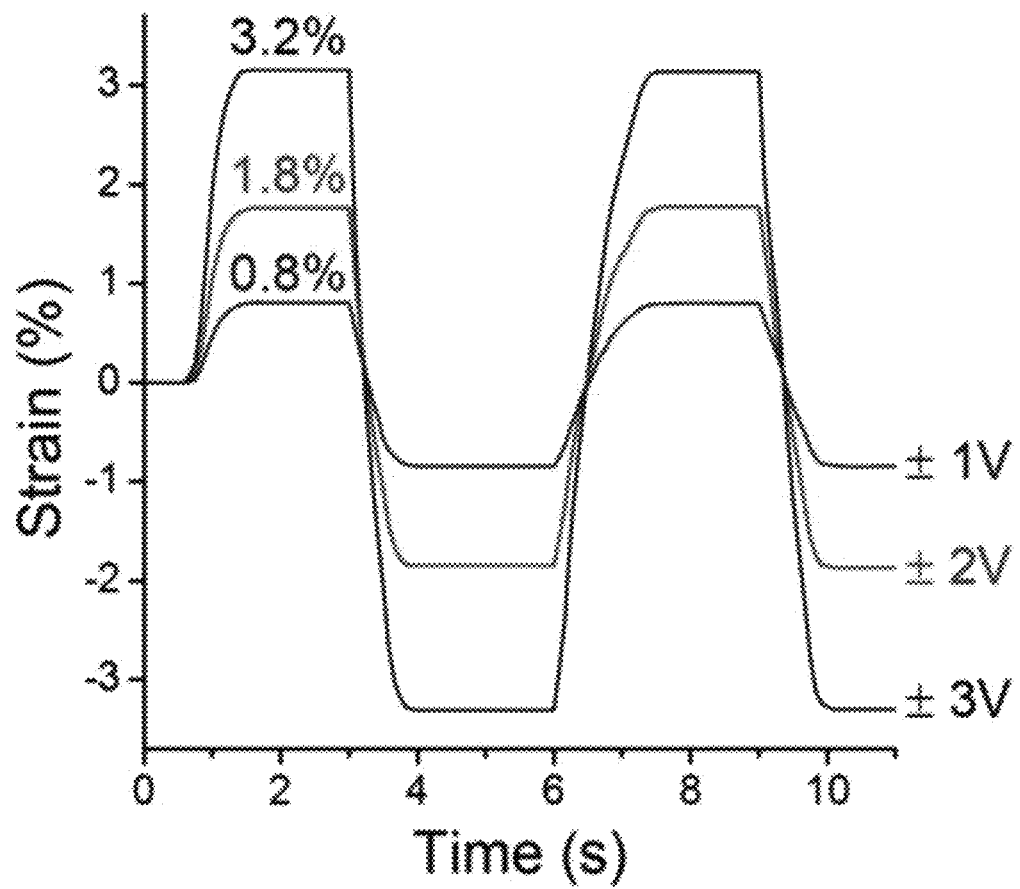

[Fig. 12]
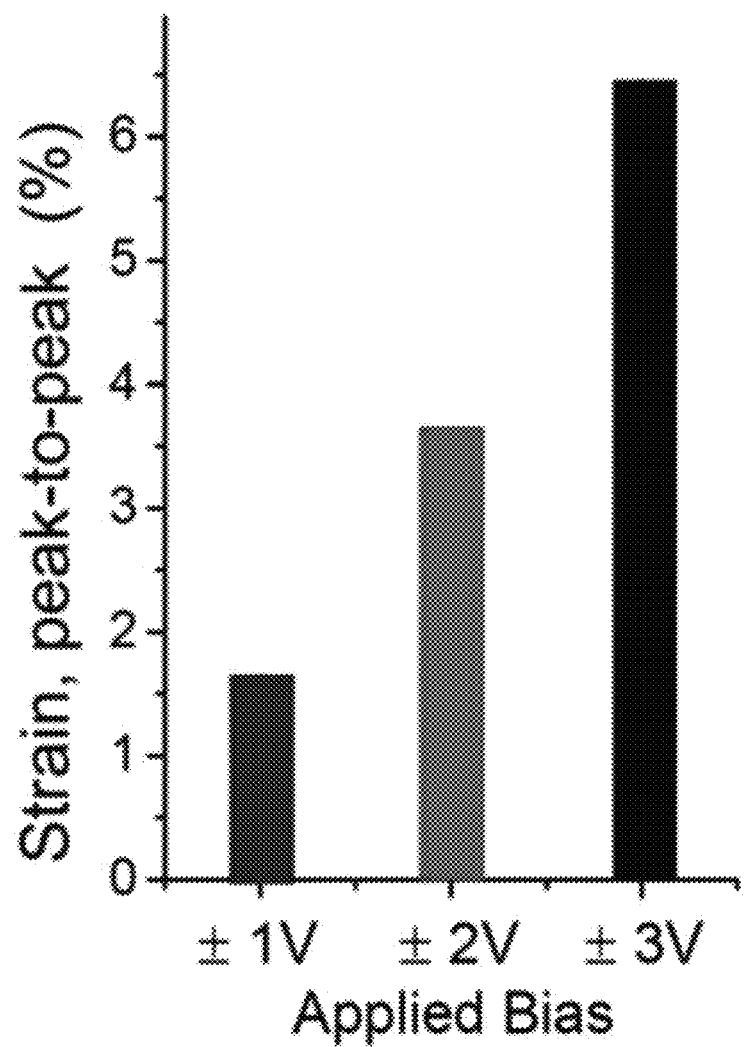

[Fig. 13]
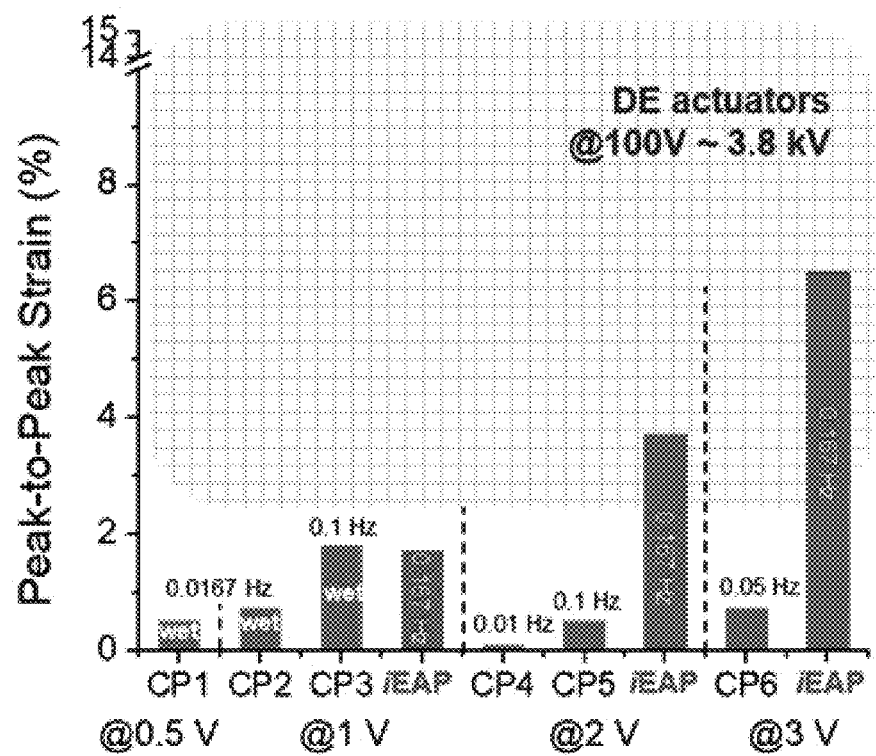

[Fig. 14]
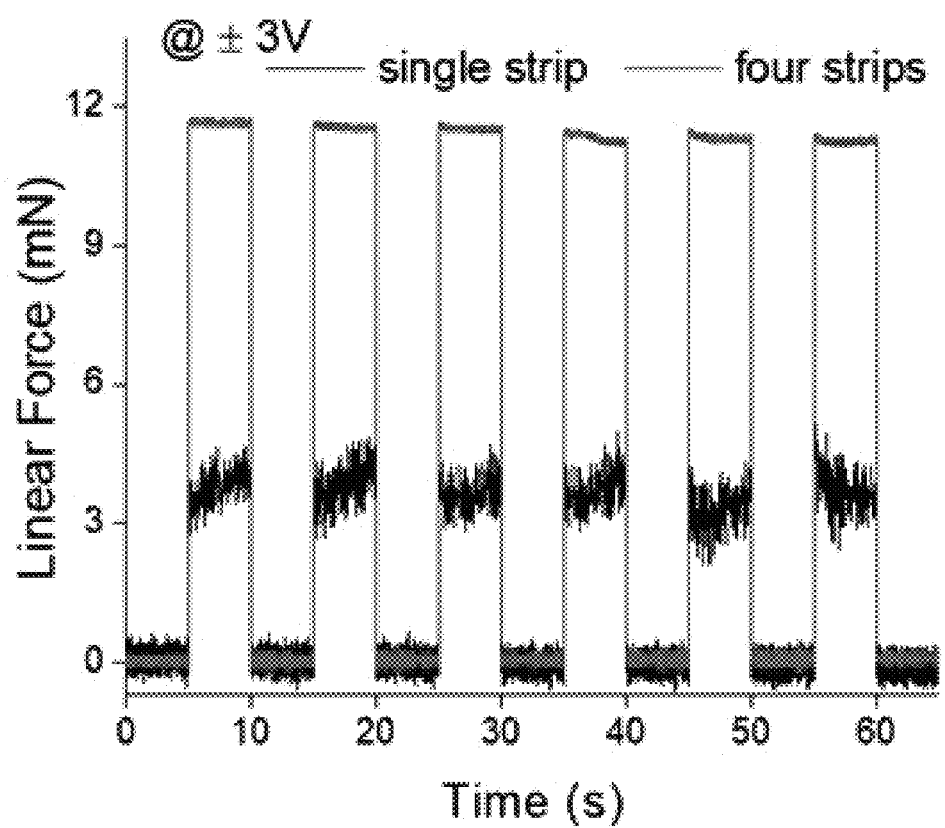

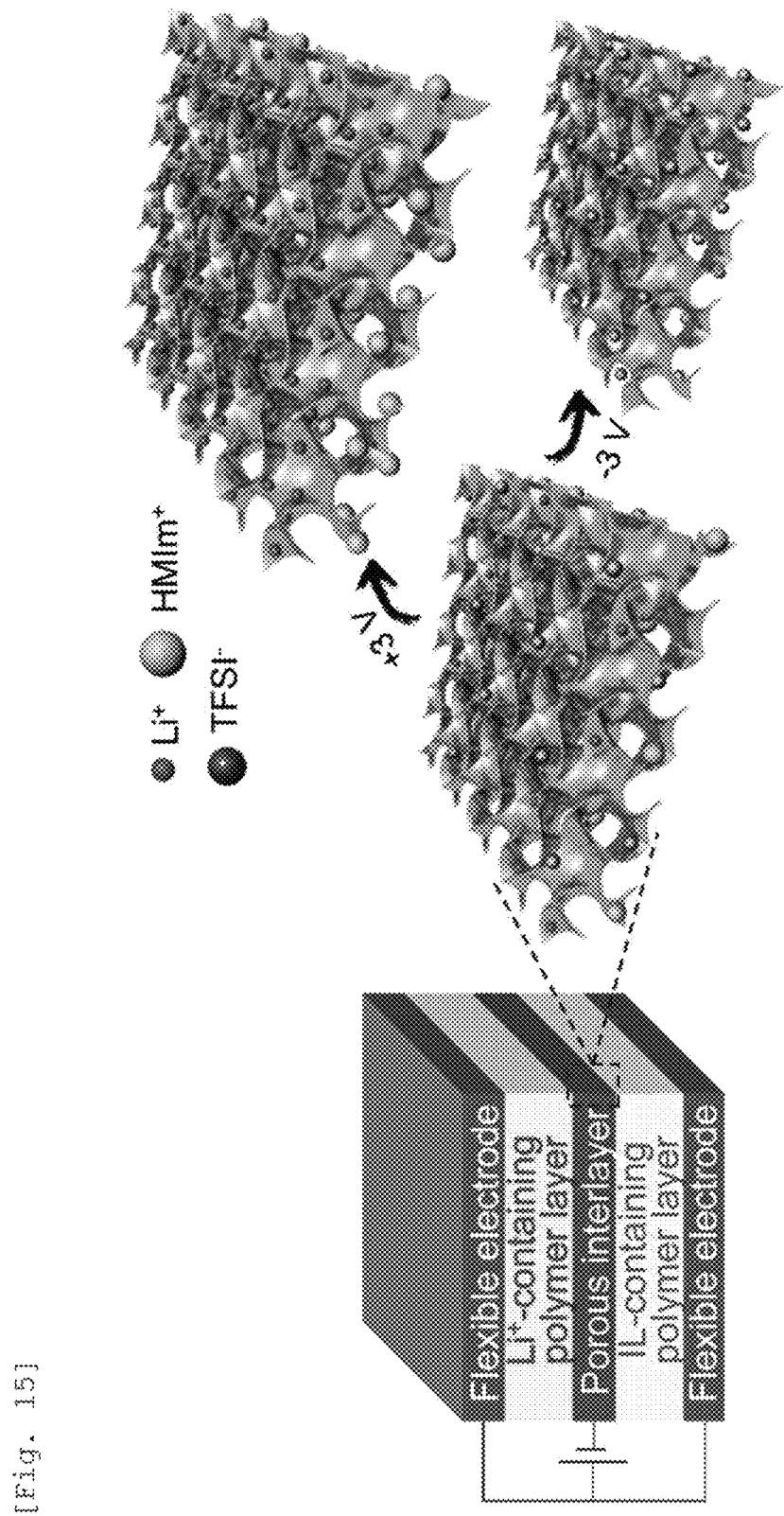
[Fig. 15]

[Fig. 16]
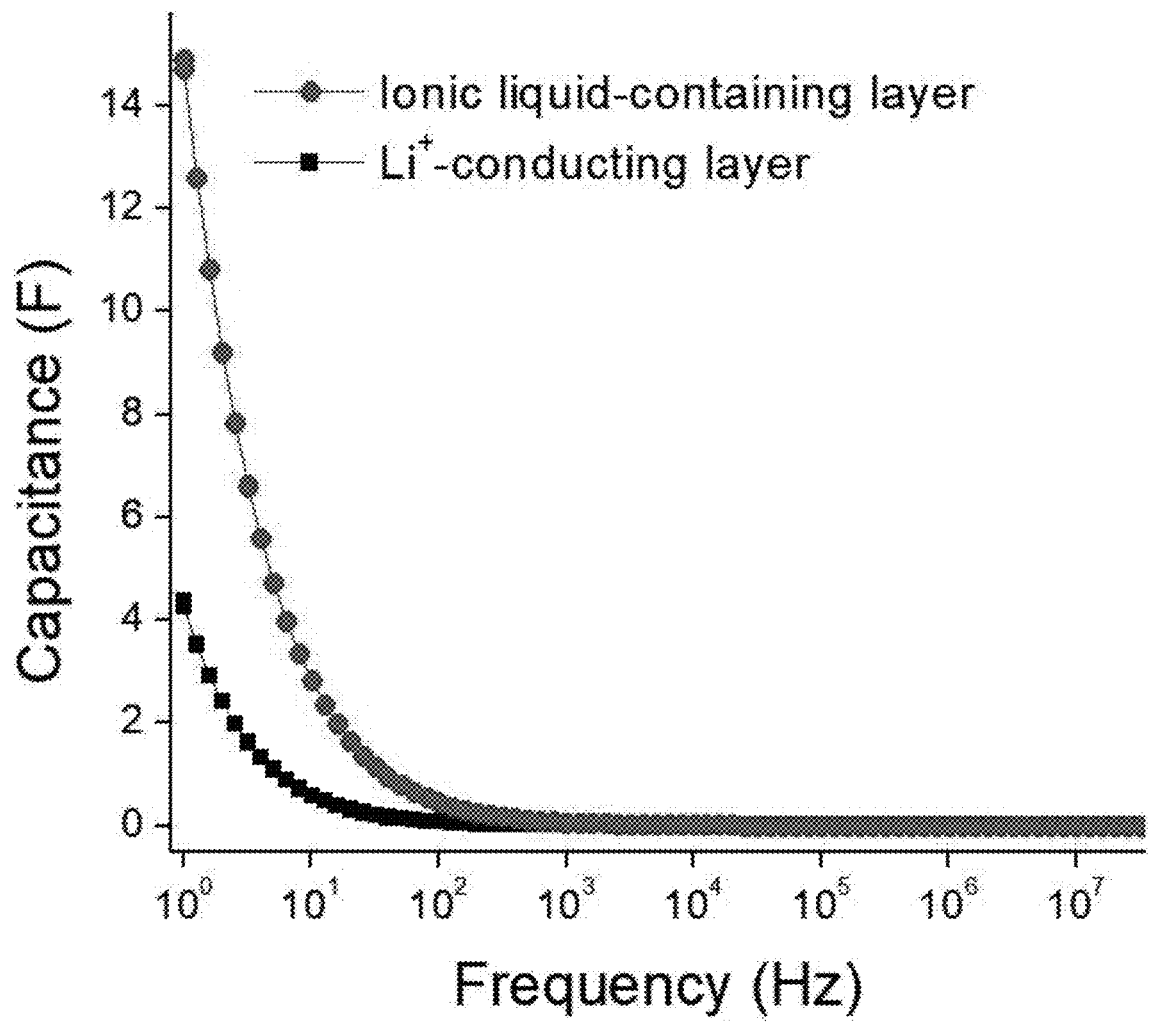

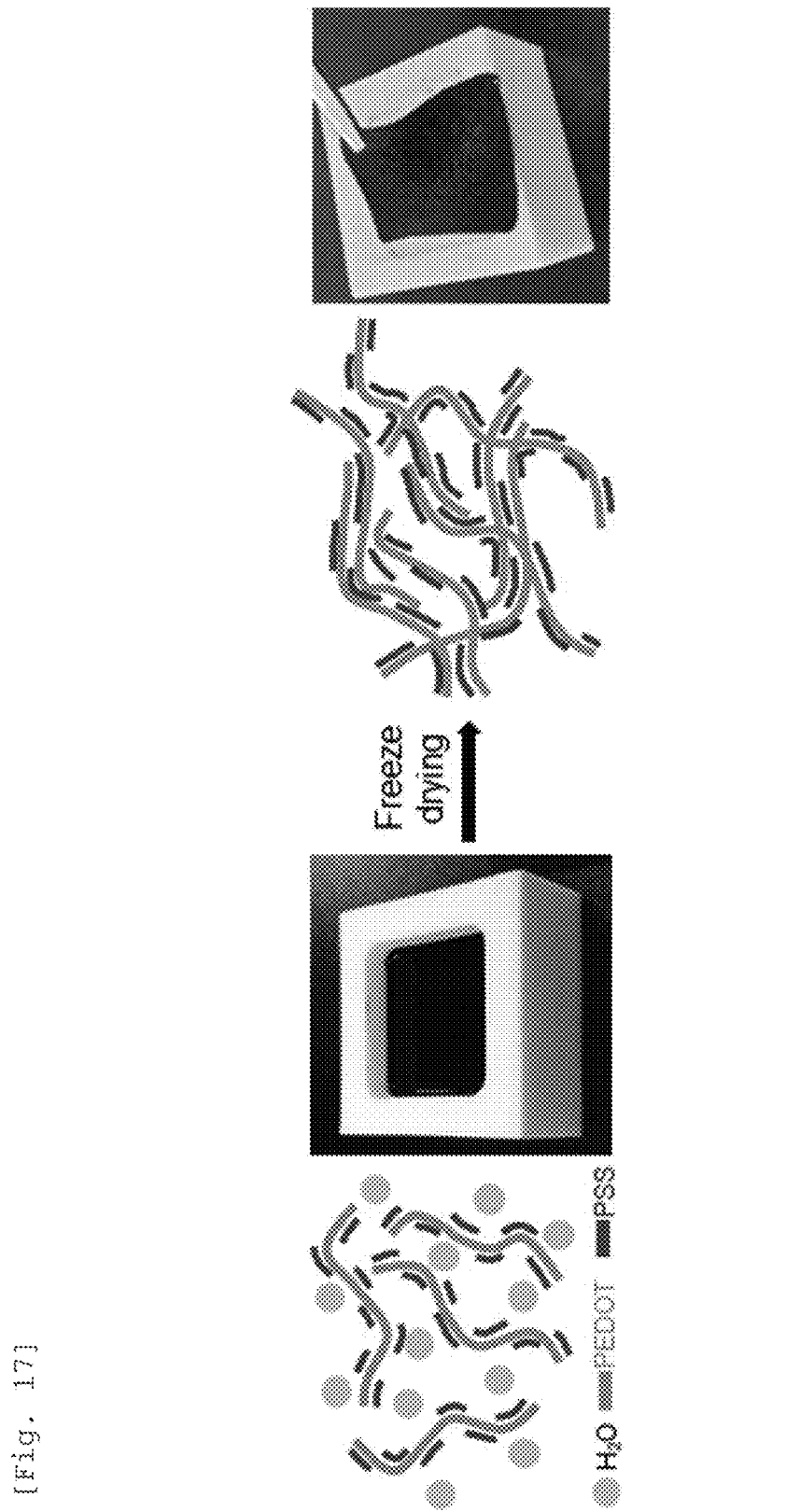
[Fig. 17]

[Fig. 18]
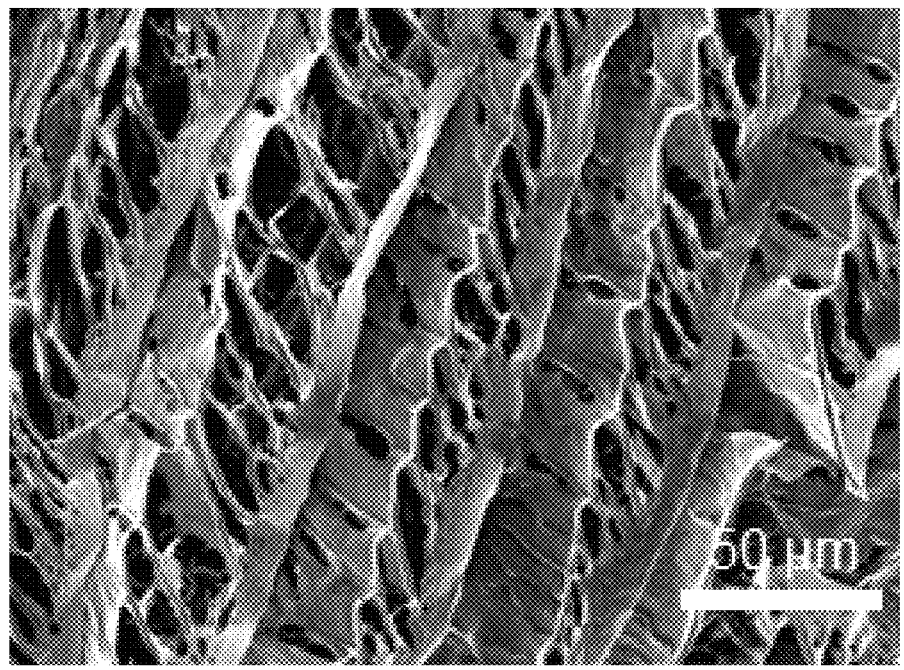

[Fig. 19]
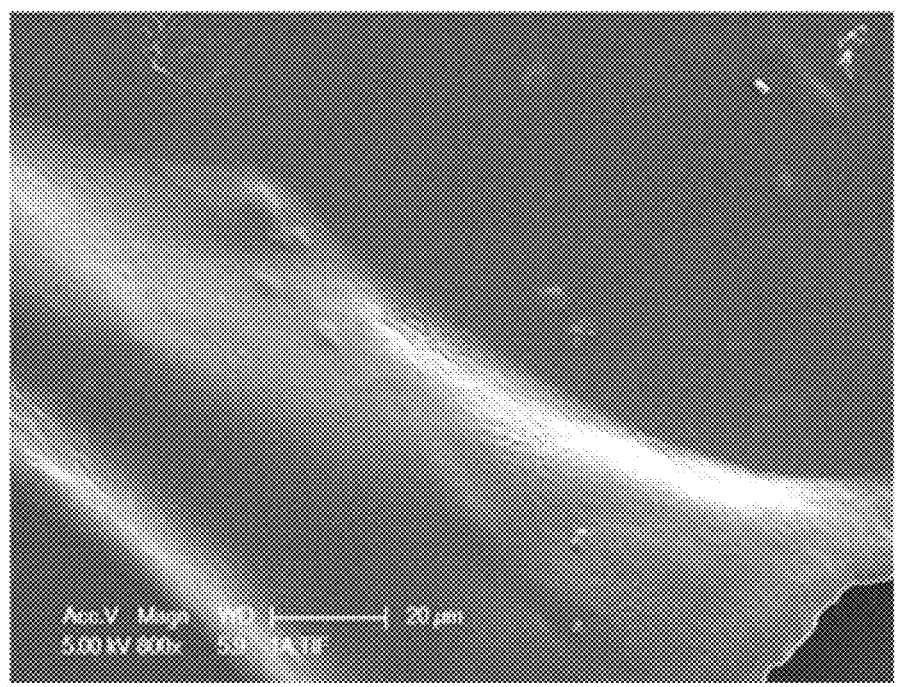

[Fig. 20]
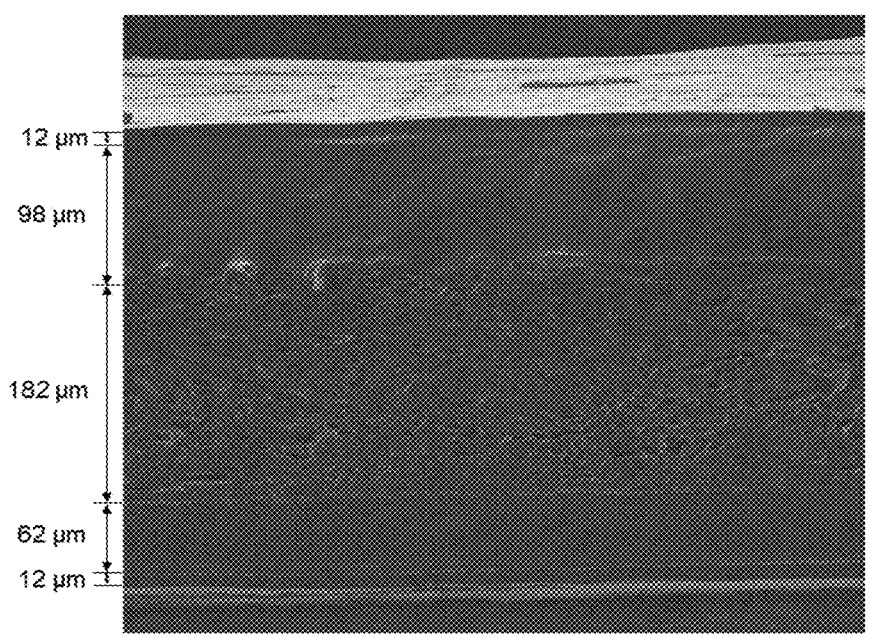

[Fig. 21]
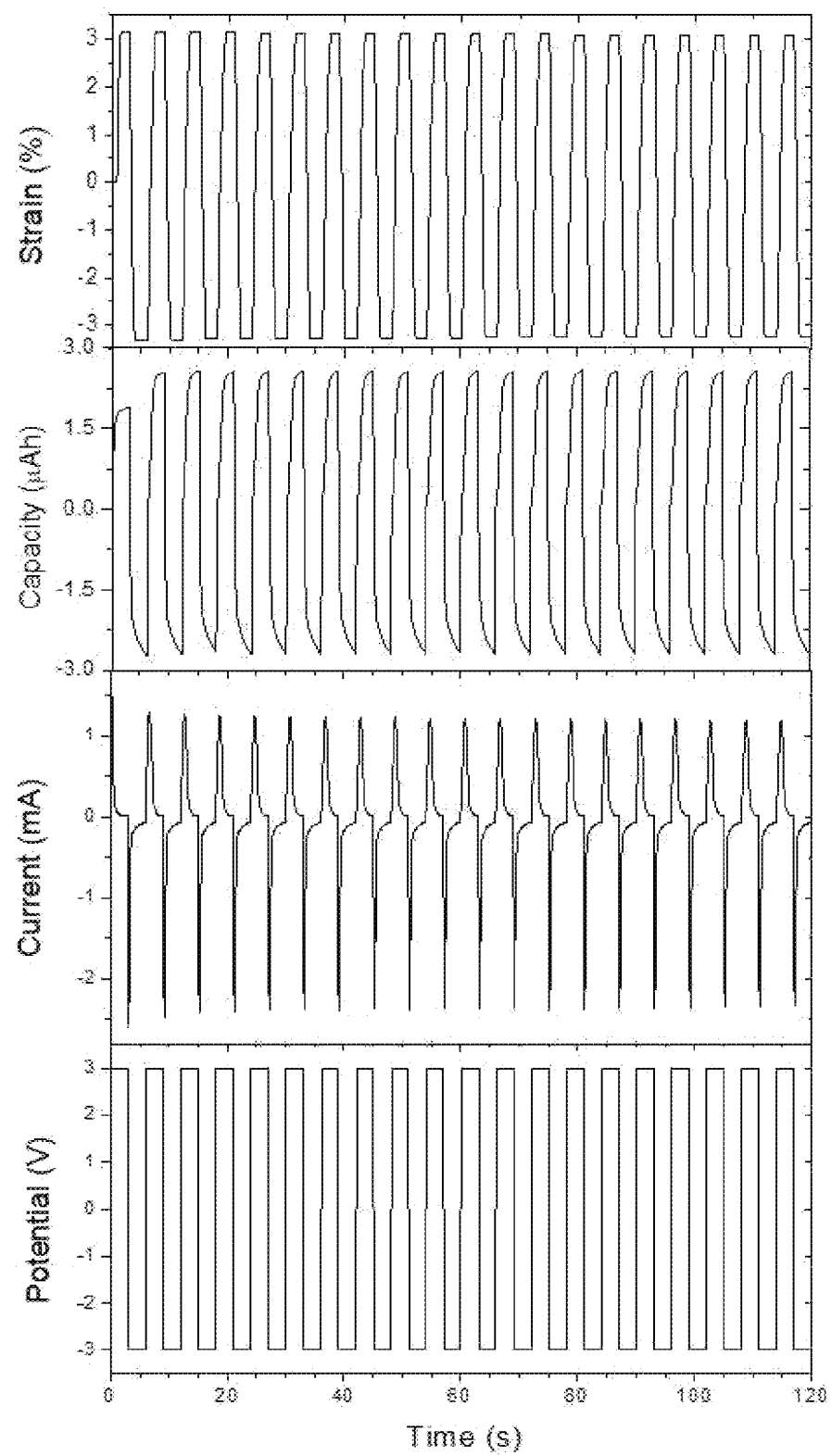

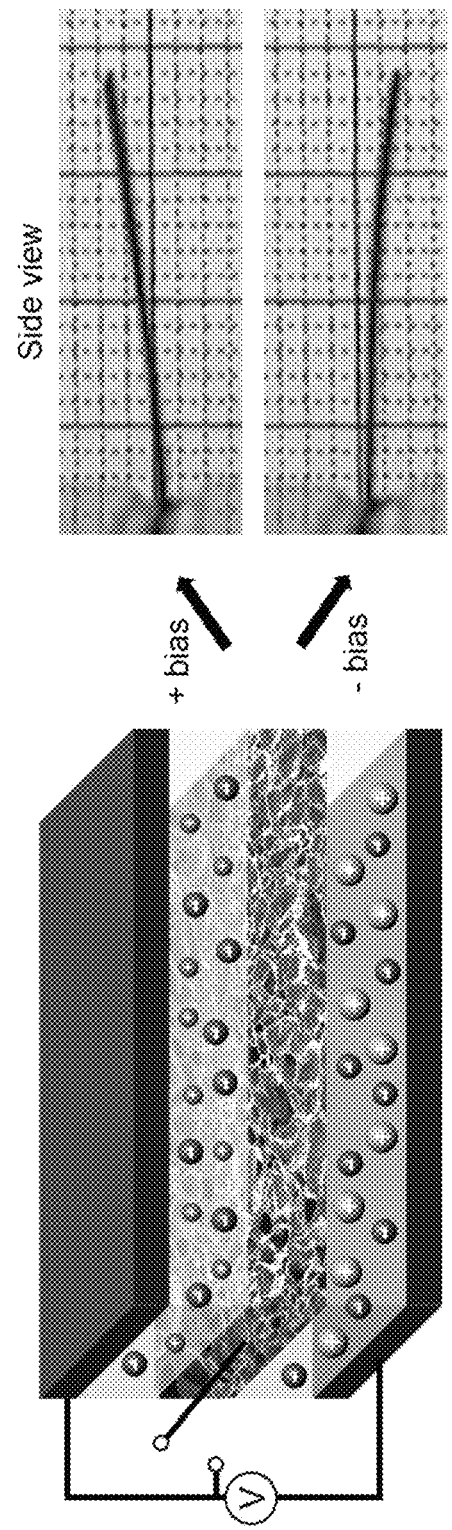
[Fig. 22]

LOW-VOLTAGE SOFT ACTUATOR CAPABLE OF LINEAR MOTION IN AIR

CROSS REFERENCE TO RELATED APPLICATION OF THE INVENTION

The present application claims the benefit of Korean Patent Application No. 10-2020-0181975 filed in the Korean Intellectual Property Office on Dec. 23, 2020, the entire contents of which are incorporated herein by reference.

BACKGROUND OF THE INVENTION

Field of the Invention

The present invention relates to a soft actuator, and more specifically, to a soft polymer actuator.

Background of the Related Art

Soft polymer actuators have become mainstream in a soft robotic technology field because of their superior capability for flexible and stretchable deformations through various stimuli such as electricity, light, temperature, pressure, pH change, and solvent vapors. Among the soft polymer actuators, ionic electroactive polymer (iEAP) actuators have low-voltage operability, high power-to-weight ratio, mechanical flexibility, and versatile deformability, and accordingly, their demand can be increased in diverse applications such as artificial muscles, biosensors, and biomimetic devices.

To maintain high charge density generation at low potentials and to eliminate problems such as slow response, back relaxation, low blocking force, and weak durability, various iEAP actuators have been developed, and recently, accordingly, the iEAP actuators have had fast responses even at 1.0 V and improved electromechanical bending of up to several millimeters (strain ~0.2%).

A series of studies on low-voltage-driven, fast-responsive iEAP actuators with large bending strains and high blocking forces under a structure in which a block copolymer electrolyte membrane characterized by well-defined nanoscale ionic channels is sandwiched between carbon nanotube electrodes have been made by Moon Jeong Park and his coworkers of Postech in Korea, and the iEAP actuators are published and granted (KR 10-1477387 and KR 10-1998019).

Further, with molecular designs of ionic additives in ion-containing polymer layers, soft iEAP actuators have succeeded, for the first time, in producing fast switching responses of tens of milliseconds, comparable to those of piezoelectric actuators.

However, despite such significant advances, the existing iEAP actuators are capable only of monotonous bending movements and nonlinear responses, precluding their practical use. When the vast majority of trilayer iEAP actuators are electrically stimulated, through ion flow in the mid-layered polymer membrane, one of the electrodes is fundamentally stretched, whereas the other is compressed, resulting in bending. Accordingly, it is hard to implement a linear motion due to the asymmetrical change between the two electrodes.

SUMMARY OF THE INVENTION

Accordingly, the present invention has been made in view of the above-mentioned problems occurring in the related art, and it is an object of the present invention to provide a low-voltage iEAP actuator that is capable of excellent electromechanical force and linear motion.

It is another object of the present invention to provide a low-voltage iEAP actuator that is capable of excellent electromechanical force and linear motion in an ambient air.

It is yet another object of the present invention to provide a low-voltage iEAP actuator that is capable of linear motion and bending motion.

It is still another object of the present invention to provide a method for fabricating a low-voltage iEAP actuator that is capable of excellent electromechanical force and linear motion in an ambient air.

It is yet still another object of the present invention to provide an interlayer for a low-voltage iEAP actuator and a method for fabricating same that is capable of excellent electromechanical force and linear motion in an ambient air.

It is another object of the present invention to provide an actuator that is capable of inducing a strong electrostatic repulsion in a horizontal direction thereof through ion diffusion and migration to thus generate a substantially high linear force when a voltage is applied and having electrodes and a polymer membrane with stretchability to thus allow the EAP membrane and the electrodes to be pulled together by linear displacement and then moved along an actuation direction.

To accomplish the above-mentioned objects, according to the present invention, there is provided an actuator including: a first ionic polymer layer disposed on underside of a first electrode layer; a second ionic polymer layer disposed on top of a second electrode layer; and a porous conducting interlayer disposed between the first ionic polymer layer and the second ionic polymer layer.

According to the present invention, the actuator may be driven at a low voltage, desirably at a low voltage less than or equal to 5 V, more desirably at a low voltage less than or equal to 3 V.

According to the present invention, the actuator may enable a linear motion and/or bending motion.

According to the present invention, desirably, the actuator may have a linear strain greater than or equal to 5% at a low voltage and may be deformed linearly in a gas atmosphere, desirably in an ambient air.

According to the present invention, the first electrode layer, the second electrode layer, and the porous interlayer may be connected to power sources for applying voltages thereto.

According to an embodiment of the present invention, the first electrode layer and the second electrode layer may be connected to a first pole power source, and the porous interlayer may be connected to a counter pole power source, thereby implementing the linear motion.

According to another embodiment of the present invention, the first electrode layer may be connected to the first pole power source, the second electrode layer may be connected to a counter pole power source, and the porous interlayer may be shorted, thereby implementing the bending motion.

According to the present invention, the first electrode layer, the second electrode layer, the first ionic polymer layer, the second ionic polymer layer, and the porous conducting interlayer may be made of stretchable materials enabling the linear motion and/or bending motion, desirably polymers.

According to the present invention, the porous conducting interlayer may have negative or positive charge to thus intercalate or deintercalate counter ions of the first ionic polymer layer and the second ionic polymer layer thereinto or therefrom, desirably may stretch or shrink through the intercalation or deintercalation of counter ions.

According to an embodiment of the present invention, the porous conducting polymer interlayer may be charged negatively to intercalate the cations contained in the first ionic polymer layer and the second ionic polymer layer into the surface and/or interior thereof, desirably into the pores thereof by means of electrostatic attraction and thus swells and stretches linearly through the intercalation of the cations.

According to an embodiment of the present invention, the porous conducting polymer interlayer may be charged positively to deintercalate the cations intercalated into the surface and/or interior thereof therefrom, desirably from the pores thereof to the first ionic polymer layer and the second ionic polymer layer and thus shrinks linearly through the deintercalation of the cations.

According to the present invention, the conducting polymer of the porous interlayer may have the morphology with three-dimensional porous networks. According to the present invention, the porous conducting interlayer may use an electrode having electrical conductivity such as a gold-coated electrode, a carbon nanotube, a polyaniline based electrode, and a porous PEDOT:PSS poly(3, 4-ethylenedioxythiophene):poly(styrenesulfonate) (PEDOT:PSS) film, desirably use the porous PEDOT:PSS film.

According to the present invention, the conducting polymer of the porous interlayer may have a thickness of 10 to 500 micrometers, desirably 20 to 400 micrometers, more desirably 100 to 250 micrometers.

According to an embodiment of the present invention, the porous conducting interlayer may have a thickness greater than the first ionic polymer layer and the second ionic polymer layer to improve mechanical properties and prevent occurrence of bending, and for example, the interlayer may have a thickness greater by 10 micrometers, desirably 20 micrometers, more desirably 30 micrometers, much more desirably 40 micrometer, most desirably 50 micrometers than one ionic polymer layer with a greater thickness than the other.

According to the present invention, the first ionic polymer layer and the second ionic polymer layer may be composed of a polymer and ionic liquid and/or metal salts.

According to the present invention, the polymers of the first ionic polymer layer and the second ionic polymer layer may be the same as each other or different from each other, desirably the same as each other to keep bonding properties therebetween under repeated deformation.

According to the present invention, the first ionic polymer layer and the second ionic polymer layer may use the polymers such as poly(vinylidene fluoride-hexafluoropropylene) (PVdf-HFP), Nafion, and end-functionalized poly(ethylene glycol) with diacrylate (PEGDA), and desirably, the first ionic polymer layer and the second ionic polymer layer may use PEGDA.

According to the present invention, the ions of the first ionic polymer layer and the second ionic polymer layer may have a combination of cations and anions.

According to the present invention, the cations may be both of metal and non-metal ions such as 1-ethyl-3-methylimidazolium ($EMIm^+$), 1-butyl-3-methylimidazolium ($BMIm^+$), 1-hexyl-3-methylimidazolium ($HMIm^+$), lithium ions, and magnesium ions. The first ionic polymer layer and the second ionic polymer layer may have different cations from each other to differently control diffusion speeds of the cations and anions owing to complementary strong electrostatic repulsion occurring from the combination of high charge density of the lithium ions and fast diffusion speeds of $HMIm^+$ and to enhance linear deformation. According to an embodiment of the present invention, the cations of the first ionic polymer layer and the second ionic polymer layer may be lithium ions and $HMIm^+$, respectively.

According to the present invention, the anions may be the same as each other or different from each other and may be both of metal and non-metal ions such as tetrafluoroborate ($BF4^-$), hexafluorophosphate ($PF6^-$), and (bis(trifluoromethane sulfonyl)imide ($TFSI^-$), and desirably, the first ionic polymer layer and the second ionic polymer layer may have the same anions as each other to differently control diffusion speeds of the cations. According to an embodiment of the present invention, the anions of the first ionic polymer layer and the second ionic polymer layer may be $TFSI^-$.

According to the present invention, the first ionic polymer layer and the second ionic polymer layer may have different thicknesses from each other to prevent a bending motion from being slightly generated due to the use of different anions therebetween, and for example, the first ionic polymer layer and the second ionic polymer layer may have a thickness difference of 10 to 100 micrometers, for example, 20, 30, 40, or 50 micrometer thickness difference.

According to the present invention, the first electrode layer and the second electrode layer may be made of the same or different materials, desirably the stretchable same polymers advantageous for the linear deformation. According to an embodiment of the present invention, desirably, the first electrode layer and the second electrode layer may be made of the same material as the porous interlayer to thus have mechanical strength equal to the mechanical strength of the porous interlayer.

According to an embodiment of the present invention, the first electrode layer and the second electrode layer may have the same PEDOT:PSS conducting polymer as the porous interlayer, excepting that the PEDOT:PSS conducting polymer thereof is non-porous.

According to an embodiment of the present invention, desirably, the first electrode layer and the second electrode layer may have the same thickness as each other, which is advantageous for linear swelling, desirably may have the same thickness as the porous interlayer.

BRIEF DESCRIPTION OF THE DRAWINGS

The above and other objects, features and advantages of the present invention will be apparent from the following detailed description of the embodiments of the invention in conjunction with the accompanying drawings, in which:

FIG. 1 is a schematic sectional view showing a five-layer iEAP actuator according to the present invention;

FIG. 2A is a sectional view showing the five-layer iEAP actuator of FIG. 1;

FIG. 2B is an optical image and chemical structure of a first ionic polymer layer of the five-layer iEAP actuator according to the present invention;

FIG. 2C is an optical image and SEM photograph of a porous interlayer of the five-layer iEAP actuator according to the present invention;

FIG. 2D is an optical image and chemical structure of a second ionic polymer layer of the five-layer iEAP actuator according to the present invention;

FIG. 3 shows ion distribution of the ionic polymer layers containing $IL^-$ and $Li^+$ separated by the porous interlayer under direct current voltage application conditions in one way in the five-layer iEAP actuator according to the present invention;

FIG. 4 is a graph showing ionic conductivities at various temperatures of the ionic polymer layers in the five-layer iEAP actuator according to the present invention;

FIG. 5 shows stress-strain curves of the ionic polymer layers in the five-layer iEAP actuator according to the present invention;

FIG. 6 shows stress-strain curves of the porous interlayer and the non-porous film electrode in the five-layer iEAP actuator according to the present invention;

FIG. 7 shows electrical conductivities and frequency-dependent capacitances between the porous interlayer and the non-porous film electrode in the five-layer iEAP actuator according to the present invention;

FIG. 8 shows the time-dependent actuation of the five-layer iEAP actuator according to the present invention to thus exhibit stable performance in an ambient air at an alternating current square-wave voltage of ±3V of a switching cycle of three seconds;

FIG. 9 shows linear swell and shrink linear strain at a driving voltage of ±3V of the five-layer iEAP actuator according to the present invention to thus exhibit fast transition response speeds;

FIG. 10 is a photograph showing linear displacement of 0.65 mm at −3 V of the five-layer iEAP actuator according to the present invention;

FIG. 11 shows relationship between strain rates and voltages of the five-layer iEAP actuator according to the present invention;

FIG. 12 shows peak-to-peak linear strains at voltages of ±1 V, ±2 V, and ±3 V of the five-layer iEAP actuator according to the present invention;

FIG. 13 shows relationship between peak-to-peak linear strains and voltages of the five-layer iEAP actuator according to the present invention, wherein the low-voltage actuator according to the present invention has higher performance than conventional soft actuators reported in the literature over the past 15 years;

FIG. 14 shows linear forces generated at ±3 V of the five-layer iEAP actuator according to the present invention;

FIG. 15 shows ion accumulation into the porous interlayer according to forward/backward DC voltage in the five-layer iEAP actuator according to the present invention;

FIG. 16 shows relationship between capacitance and frequencies of the PEGDA membranes containing ionic liquid and $Li^+$ used as ionic polymers in the five-layer iEAP actuator according to the present invention;

FIG. 17 shows processes of fabricating a porous film composed of PEDOT:PSS:Triton X used as the interlayer of the five-layer iEAP actuator according to the present invention, wherein film photographs before and after freeze drying are suggested;

FIG. 18 shows an SEM image of the porous film composed of PEDOT:PSS:Triton X that is subjected to freeze-drying at −10° C. in the five-layer iEAP actuator according to the present invention;

FIG. 19 shows an SEM image of the porous film composed of PEDOT:PSS:Triton X that is subjected to normal drying at 40° C. in the five-layer iEAP actuator according to the present invention;

FIG. 20 shows an SEM image of the section of the iEAP actuator according to the present invention, wherein the porous interlayer has a thickness of ~20 μm, the polymer layer containing $Li^+$ a thickness of ~60 μm, the polymer layer containing ionic liquid a thickness of ~70 μm, and the flexible outer a thickness of ~20 μm;

FIG. 21 shows time-dependent strains, capacitances, currents, and applied voltages of the five-layer iEAP actuator according to the present invention to thus exhibit stable actuation performance in an ambient air at an alternating current square-wave voltage of ±3V of a switching cycle of three seconds; and FIG. 22 shows a photograph of the five-layer iEAP actuator according to the present invention in which AC square-wave voltages of ±3V are applied only between the outer electrodes and the ionic polymer layers strains and the porous interlayer does not electrically come into contact with a potentiostat so that bending deformation occurs.

DETAILED DESCRIPTION OF THE PREFERRED EMBODIMENT

Hereinafter, embodiments of the present invention will be explained in detail. The embodiments of the invention are not intended to limit the invention but just to exemplify the invention.

Low-voltage polymer actuators as key drivers for next-generation soft robots are distinctly in the limelight because of their electromechanical conversion performance even at a few driving volts. The problems the low-voltage polymer actuators have had, such as slow response, back relaxation whose control is impossible, low blocking force, and low durability have been solved one by one through past studies, but the low-voltage-driven polymer actuators have many limitations in their practical use as drivers for soft robots because they show only monotonous bending motions. Accordingly, the inventors have developed a low-voltage polymer actuator with fast linear motions in ambient air. The new actuator has five layers, and in specific, the actuator has a unique structure in which a porous conducting polymer interlayer is sandwiched between different ionic polymer layers from each other. The interlayer is synthesized by using ice to optimize its stretchability, and ionic polymer layers are stretchable polymers containing lithium salts and ionic liquid, respectively, to independently control the diffusion rates of cations and anions. The low-voltage linear motion actuator according to the present invention exhibits a maximum strain rate of 6.5% at 3 V (1.7% at 1 V and 3.6% at 2 V) and 0.8 s switching time required up to the maximum deformation from stationary phase, thereby providing unprecedented superior properties. Besides, the low-voltage linear motion actuator according to the present invention produces a mean 4.2 mN linear blocking force at ±3V and shows stable contraction and expansion characteristics for 500 cycles run. Therefore, the low-voltage linear motion actuator according to the present invention will be one innovation in future soft robotic technologies.

Hereinafter, the present invention will be explained in detail with reference to the attached drawings.

Embodiment

FIG. 1 is a schematic view showing a five-layer iEAP actuator structure in which a conducting interlayer 30 is located on a central portion thereof, a first ionic polymer layer 20 and a second ionic polymer layer 40 are located to cover top and underside of the conducting interlayer 30, and a first flexible electrode 10 and a second flexible electrode 5 are located to cover top and underside of the first ionic polymer layer 20 and the second ionic polymer layer 40.

FIG. 2A shows the five-layer iEAP actuator structure in which the conducting interlayer is located on the center portion thereof and thus covered with two bilayers of the ionic polymer layer and the flexible electrode and further shows that two different ion-containing ionic polymers can independently control the diffusion rates of cations and anions in each polymer layer. To fabricate the ionic polymers, end-functionalized poly(ethylene glycol) with diacrylate (hereinafter referred to as PEGDA) is synthesized and doped with lithium salts or ionic liquid (IL).

Through UV crosslinking of polymer electrolytes with various molecular weights of PEGDA and different types of lithium salts (or ionic liquid), stretchable polymer layers with tunable ionic conductivities are produced. For the brevity of the description, the embodiment of the present invention handles only the representative data obtained from a subset of PEGDA electrolyte membranes that resulted in superior linear responses from the fabricated actuators. FIGS. 2B and 2D show the representative photographs and chemical structures of the PEGDA layer.

The interlayer is a conducting polymer film and is a key component of the five-layer iEAP actuator that enables linear motions by maximizing charge accumulation. In view of the striking capabilities of porous electrodes to enable high capacitance and provide adequate ion storage to deliver efficient electrochemical-mechanical output, three-dimensional porous poly(3, 4-ethylenedioxythiophene):poly(styrenesulfonate) (PEDOT:PSS) fabricated through freeze-drying with the addition of a surfactant, Triton X-100 (optimized to 3 wt % via electrical conductivity and tensile tests) is thus analyzed according to the present invention. The as-obtained sponge-like films are pressed to create uniform, thin, and freestanding interlayer films. FIG. 2C shows the morphology of the porous interlayer that is obtained by a scanning electron microscope (SEM).

To fabricate the five-layer high-performance iEAP actuator according to the present invention, therefore, ion relaxation dynamics in the two ionic polymer layers and charge accumulation in the porous interlayer are primarily focused and studied.

In the case of the ionic polymer layers using the PEGDA layers, as schematically shown in FIG. 3, Bis(trifluoromethanesulfonyl)imide (TFSI$^-$: blue color in the figure), which is characterized by a bulky size and highly delocalized charges, is fixed as a common anion for both the lithium salt and IL.

Further, 1-Hexyl-3-methylimidazolium (HMIm$^+$:green color in the figure) is chosen as the cation so as to achieve a large actuation strain under a given bias because of its fast diffusion and large molar volume. The lithium anion (with red color in the figure) has slower diffusion and smaller size than HMIm$^+$ and TFSI$^-$. Namely, HMIm$^+$ diffusion is faster than that of TFSI$^-$ in the IL-containing PEDGA, whereas TFSI$^-$ migration prevails in LiTFSI-doped PEGDA. Even though defined theoretically, 1-Hexyl-3-methylimidazolium (HMIm$^+$: green color) has fast diffusion because of a high degree of delocalization and large strains because of a bulky size, but in the case of the lithium cation, positive charges are collected and small in size so that they have slow diffusion and small strain at the same voltage. Accordingly, the diffusion of HMIm$^+$ is a key factor in the IL-containing polymer layer, and the diffusion of TFSI$^-$ as anion is a key factor in the polymer layer containing the lithium salt. As a result, different ions on the opposite interfaces to each other are dominantly accumulated, so that linear motions, not bending motions, occur.

FIG. 4 shows that a higher ionic conductivity of the PEGDA film (1) including HMImTFSI than that of the PEGDA film (2) doped with LiTFSI. This difference can be ascribed to the strong ion dipole interaction of Li$^+$ with ether oxygen atoms on the ethylene oxide units of PEGDA, which stiffens the PEGDA chains and increases its glass transition temperature ($T_g$).

On the other hand, HMImTFSI works as a plasticizer, and thus, HMIm$^+$ ions form a weaker ion dipole complexation with PEGDA, thereby offering faster ion relaxation than that produced by Li$^+$. This phenomenon lowers the $T_g$ of PEGDA and allows rapid ionic polarization/depolarization, which causes the IL-containing polymer layer to exhibit a higher charge density as compared to that of the Li$^+$-doped polymer layer, as shown in FIG. 16.

To offset the dissimilar dielectric effects exerted by Li$^+$ and HMIm$^+$ in the PEGDA membranes oppositely assembled on the two sides of the interlayer, the IL-containing PEGDA layer is optimized to be thicker (~70 μm) than its Li$^+$-doped polymer layer (~60 μm). FIG. 5 shows a stress-strain curve expressing good mechanical stretchability of the two polymer layers adequate for linear deformation with mediated ion distribution kinetics.

As shown in FIG. 6, the PEDOT:PSS interlayer and the outer electrodes have the tensile strain of a maximum 22% higher than the porous interlayer (as shown in FIGS. 17 to 19, which has the same structure as prepared in the exiting drying way where a porous structure is not formed) having a final thickness of 20 μm. The porous interlayer has electrical conductivity of 19 Scm$^{-1}$, which is attributed to an increase in the volumetric density of PEDOT nanofibrils with the aid of Triton X-100 (a neat PEDOT:PSS has electrical conductivity of 1.1 Scm$^{-1}$). However, the value is somewhat reduced from electrical conductivity of 23 Scm$^{-1}$ of a non-porous PEDOT:PSS film. So as to fabricate the five-layer iEAP actuator, according to the present invention, the interlayer is made of only the porous film subjected to freeze drying, and the films with the non-porous structure are used as two outer electrodes and simultaneously attached to top and underside of the polymer membrane doped with Li$^+$ or containing IL, respectively. The SEM image of the section of the multi-layer iEAP actuator is shown in FIG. 19.

The three-dimensional porous interlayer not only acts as an efficient buffer against stress during deformation by preserving the interconnected network, but also maximizes charge accumulation during ion intercalation (deintercalation) from (to) the adjacent polymer membrane under applied bias. FIG. 7 shows the capacitance of the porous interlayer that is remarkably higher by three times than the non-porous film. Through the introduction of the porous interlayer, the charge accumulation during actuation is maximized.

FIGS. 8 and 9 show the time-dependent linear actuation performance of the five-layer iEAP actuator at an alternating square-wave voltage of ±3 V with a switching cycle of 3 s in ambient air. Notably, the five-layer iEAP actuator demonstrates 500 cycle stable performance in air, and the amount of linear displacement (δ) is evaluated from the gap between the actuator tip and its extent of displacement at a given bias. The corresponding linear strain (ε) values for expansion (+3 V) and compression (−3 V) are calculated from the δ values.

Notably, the five-layer iEAP actuator demonstrates a rapid switching response, as shown in FIG. 9. The time required to complete linear expansion was only 0.8 s at 3 V. Once equilibrium was reached, the actuator maintains its expanded position until the bias is altered to enforce a reversal of ion migration, and when contracted, it shows a faster restoring actuation motion than when expanded. FIG. 10 shows representative images of five-layer iEAP actuator that are exhibited at 0 V (stopped) and 3 V (contracted). The corresponding current, voltage, and capacitance profiles as functions of elapsed time are shown in FIG. 21, while demonstrating the reversible and rapid expansion/contraction responses of the iEAP actuator with retention of structural and chemical integrity.

Because one of the objects of the present invention is to achieve linear motion at a practically low operating voltage, the linear response of the five-layer iEAP actuator from 1 to 3 V is monitored to thus check applications for the IEAP actuator. The five-layer iEAP actuator demonstrates the highest linear value of 3.2% at +3 V and a peak-to-peak strain ($\varepsilon_p$) of 6.5% at ±3 V, corresponding to a linear displacement of 0.65 mm. At lower driving voltages, linear values of up to 0.8% and 1.8% ($\varepsilon_p$ values of 1.7% and 3.6%) were determined for square-wave voltages of ±1 V and ±2 V, respectively, as shown in FIGS. 11 and 12. This indicates that the electromechanical deformations of the five-layer iEAP actuator are roughly proportional to the applied voltage, eliminating the possible occurrence of undesired faradaic reactions.

Notably, the intercalation of ions into the porous interlayer has a key role in determining the actuation response. Through the use of a non-porous interlayer, inconspicuous actuation is achieved by the five-layer iEAP actuator regardless of the driving voltage. Further, applying bias only between the two outer electrodes (keeping the interlayer disconnected) of the actuators results in only dominant bending deformation (See FIG. 22) due to the prevailing migration of cations toward the negative electrode and vice versa, generating an ion concentration gradient favorable for the bending of trilayer iEAP actuators. Therefore, the ability of the iEAP actuator according to the present invention that can selectively express versatile (bending or linear) motions is unprecedented.

FIG. 13 shows a comparison of the voltage-dependent linear strain of soft actuators reported in the literature over the past 15 years. The only existing ionic actuators capable of low-voltage stimulated linear motion with a strain of over 1% are conducting polymer (CP) actuators, excepting a dielectric elastomer (DE) actuator needing a high voltage. However, their performance is limited only to wet or submerged conditions. Further, these actuators have extremely slow switching speeds. It is evident that the five-layer iEAP actuator according to the present invention represents significant progress in the era of linear-motion soft actuators, given that it exhibits a linear strain of >6% even though the driving voltage was reduced by several tens to hundreds of times.

In the case of trilayer actuators with one ionic membrane between two symmetric electrodes, the typical ion concentration gradient under bias causes an opposite volume change (in which one electrode swells and the other electrode shrinks) for each electrode, impeding linear deformation. If linear motion is sought, the actuators must be immersed in an electrolyte solution to provide symmetric expansion and contraction force for the outer electrodes via volume change during a redox reaction, limiting their practical applicability. A representative example is a conducting polymer (CP) actuator (as shown in FIG. 13).

In view of this, the keys to designing a five-layer linear-motion iEAP actuator operable in dry environments are (1) the use of two different solid-state ionic polymer membranes inside the outer electrodes, (2) the introduction of stretchable and three-dimensional porous interlayer, and (3) the use of soft components with balanced electromechanical properties. The five-layer iEAP actuator designed is similar to a bi-morph-type with both cation and anion exchangers. The resultant system is an electrolyte storage (reduction of cation exchanger and oxidation of anion exchanger) suitable for linear expansion at an applied voltage, whereas the reversal of bias expels these ions to enable contractile motion.

The force of constant linear swelling in a plane direction that is measured by connecting a force sensor to the tip portion of the five-layer iEAP actuator shows stable outputs of 4.2 mN at ±3 V at intervals of 10 s (See FIG. 14). Excess accumulation and rapid intercalation of cations into the pores at the PEGDA-interlayer interface occur for 0.3 s, which generates an electrostatic repulsion force of up to 2.2 mN. When the bias is reversed, cations migrate from the pores and toward the outer electrodes, minimizing charge storage at the interlayer and thus rapidly creating a compressive force of 2.0 mN. The constant force in the plane direction is empowered by the preserved ion concentration gradient at the electrodes, because they are in contact with solid-state ion sources. In specific, if the porous interior is bonded, dielectric properties and charge accumulation are significantly improved, which are the key factors for attaining a high force from the iEAP actuator using only a few volts.

The electromechanical transduction of the five-layer iEAP actuator is further estimated using an electromechanical model, with the interlayer considered as a capacitor that charges and discharges by ion diffusion. Once a positive field is applied, cations travel toward the interlayer and charge both interlayer-membrane interfaces. The interlayer facilitates ion-charge pair intercalation into its pores via diffusion, which results in mechanical expansion via electrostatic pressure (Maxwell stress) based on the linear elasticity assumption for strains <10%, while electrostriction effects remain negligible.

For an actuator of length L, width w, and thickness t exhibiting linear deformation ΔL, the forces of the individual layers can be defined as follows:

$$F_{IL} = \varepsilon_1 E_1 S_\varepsilon \quad (IL\text{-containing layer}) \tag{1}$$

$$F_{Li} = \varepsilon_2 E_2 S_\varepsilon (Li^+\text{-containing layer}) \tag{2}$$

$$F_{Int} = \varepsilon_3 E_3 S_\varepsilon + \frac{C_3 V^2 S_\varepsilon}{A d_3} - \frac{\alpha_3 q_3 E_3 S_\varepsilon}{V_3} \quad (\text{Interlayer}) \tag{3}$$

$$F_{Ele} = \varepsilon_4 E_4 S_\varepsilon + \frac{C_4 V^2 S_\varepsilon}{A d_4} - \frac{\alpha_4 q_4 E_4 S_\varepsilon}{V_4} \quad (\text{Each outer electrode}) \tag{4}$$

where ε represents the strain, $S_e$ the surface area of contact varying with ε, A the area of the compliant electrode, $E_i$ is the modulus, $C_i$ is the capacitance, $\alpha_i$s the strain-to-charge ratio, and $q_i$ is the charge density for individual layers with thickness $d_i$ at applied voltage V. Based on the assumption that the electrostatic pressure ($C_i V^2/Ad_i$) is the prime factor driving the linear motion and restoration force ($\alpha_i q_i E_i/V_i$) to be negligible, the output force can be calculated based on the cumulative force of individual layers as follows:

$$F_{out} = SeE_iS_e + C_3V^2S_e/Ad_3 + 2C_4V^2S_e/Ad_4 \tag{5}$$

For simplification, a few boundary conditions are applied: (1) the change in surface area of contact among individual layers occurs mostly in the length direction, where $S_e$=w (L+ΔL), (2) changes in width by 0.2% and thickness by 0.01% correspond to a linear deformation of 4%, and (3) two outer electrodes provide identical stress. Through the fitting of the experimental parameters from the stress-strain and capacitance curves into Equation (5), a theoretical force of 6.5 mN can be predicted for a linear deformation of 3.5%, implying the possibility of achieving high-force linear deformation by an iEAP actuator using multilayer designs.

In summary, the porous interlayer, which plays an important role in determining performance of an actuator, is adopted to provide the five-layer iEAP actuator with linear motions at low voltage in open air. The porous interlayer acts as an efficient ion reservoir that maximizes charge accumulation and provides electrostatic interaction-mediated stress, leading to linear deformations. Based on a comparison of the linear strain values realized by the actuator according to the present invention as a function of operating voltage with those of other soft actuators reported in the literature, it is evident that the actuator according to the present invention works best at only a few volts. The actuator also exhibits a linear strain dependency against voltage, fast switching speed, and stable operation at ambient conditions. The results confirm that the approach for the construction of the multilayer iEAP actuator according to the present invention that can operate at low driving voltages equivalent to a small battery paves the way for complex deformations of wearable soft devices.

Synthesis of End-Functionalized Polyethylene Glycol

Poly(ethylene glycol) diacrylate (PEGDA) was synthesized by following procedure reported by Tayalia research staffs. First, PEG of average $M_n$=10,000 g/mol$^{-1}$ (10 g, 1 mmol) was dried by azeotropic distillation in toluene (100 mL) and dissolved in anhydrous dichloromethane (100 mL) by stirring at room temperature. Acrylation of hydroxyl groups of PEG was carried out by sequential addition of anhydrous trimethylamine (5 mmol) and acryloyl chloride (5 mmol) to reaction mixture. After stirring for 24 h at argon atmosphere, insoluble triethylammonium chloride formed as precipitate was removed by filtration and solvent was dried by air blow. The product was then dissolved in dichloromethane and washed with distilled water to remove any inorganic impurity. Next, PEGDA was finally precipitated by adding excess of chilled diethyl ether and dried in a vacuum oven at a room temperature for a day. The degree of acrylation of PEGDA was monitored by $^1$H NMR spectra recorded in chloroform-d. All aforementioned chemicals were purchased from Sigma-Aldrich.

Fabrication of Ionic Polymer Membranes

To prepare free-standing ionic polymer membranes, two separate mixtures of PEGDA and LiTFSI (>98%, TCI) and PEGDA and HMImTFSI (>98%, TCI) were mixed at the weight ratio of 60:40 wt % and then prepared inside the glove box in an argon atmosphere. 1-Hydroxycyclohexyl phenyl ketone (Sigma-Aldrich) at 1 wt % ratio to PEGDA was added as photo-initiator and stirred for 1 h. Each solution was dropped on cleaned glass substrates and spread by doctor blade technique with desired thickness prior to cure for 30 min under LED UV lamp (Phoseon, 2 W cm$^{-2}$) at room temperature. The polymer membranes were further vacuum dried at 40° C. for a day to eliminate any traces of organic solvent. In order to fabricate the bilayers of polymer membranes and outer electrodes, aforementioned mixtures were directly dropped on top of the electrode films, as described in the following.

Fabrication of Stretchable Interlayer and Outer Electrodes

To make the porous and stretchable PEDOT:PSS interlayer film, a 97:3 wt % mixture of PEDOT:PSS (1.3 wt % dispersion in H$_2$O, conductive grade, Sigma-Aldrich) and Triton X-100 ($C_{14}H_{22}O(C_2H_4O)_n$, n=9-10; Sigma Aldrich) was formed by stirring overnight. Next, 4 mL of this mixture was poured on a Teflon mold (2 cm×2 cm×1 cm) and subjected to freeze at −20° C. for 12 h prior to be kept inside freeze drier (Labconco FreeZone 2.5 L). A sponge-like PEDOT:PSS film was obtained after freeze drying for 48 h. This was dried in a vacuum oven at 50° C. overnight and pressed (2 mbar, 5 min) between two Kapton spacers to get free-standing film with average thickness of ~20 µm. To fabricate the soft outer electrodes, same procedure was repeated without freeze drying step (dried in oven at 35° C. for 48 h followed by vacuum drying at 50° C. overnight). These films were fixed on Teflon plates and precursor solutions of polymer membranes were dropped on top, spread by doctor blade and UV cured.

Fabrication of Five-Layer iEAP Actuator

The actuator (total thickness of ~360 µm) was fabricated by sandwiching bilayers of PEDOT:PSS outer electrode (thickness ~12 µm)/LiTFSI-containing PEGDA membrane (thickness ~60 µm) and PEDOT:PSS outer electrode (thickness ~12 µm)/HMImTFSI-containing PEGDA membrane (thickness ~100 µm) on either side of a porous PEDOT:PSS interlayer film (thickness ~180 µm). The thicknesses of layers were measured by cross sections observed by a field emission type scanning electron microscope (FE-SEM) (Phillips electron optics B. V., XL30S FEG) at 5 keV operating voltage.

Actuator Performance Tests

The five-layer iEAP actuator was clipped with two Cu strips to have 5~10 mm of free length from Cu contact points and the interlayer was connected to another Cu strip having the same free length. The square-wave voltages across the Cu strips were then applied using a potentiostat (VersaSTAT3, Princeton Applied Research, AMETEK Inc.) at ambient conditions with relative humidity of 25%. The motion of actuators as a function of applied voltage was recorded using a Zeiss microscope (AxioVision) equipped with a CCD camera. As a result, the five-layer actuator showed linear motions at an alternating square-wave voltage of ±3 V with a switching cycle of 3 s in ambient air.

Actuator Force Measurements

The force of actuator was measured using LVS-5GA testing machine (Kyowa Electronic Instruments, Japan) fitted with a load cell having maximum sensitivity of 50 mN. A direct current (DC) voltage at an interval of 10 s was applied to the actuator using a potentiostat (VersaSTAT3, Princeton Applied Research, AMETEK, Inc.) and force on the load cell was monitored using dynamic data acquisition software at ambient conditions with relative humidity of 25%.

Ionic Conductivity and Capacitance Measurements

Temperature-dependent ionic conductivities of freestanding ionic PEGDA membranes were measured inside the glove box using alternating current (AC) impedance spectroscopy in $10^{-2}$-$10^6$ Hz frequency range. The samples were equilibrated at designated temperature for 15 min prior to each measurement. To evaluate the charging effects of individual layers, DC voltage of 3 V was applied to the sample with a diameter of 7 mm and a thickness of 0.21 mm for 40 s using a potentiostat (VersaSTAT3, Princeton Applied Research, AMETEK, Inc.) and then voltage was set to zero. The time-dependent charging current was recorded and integrated to obtain stored charge in the samples.

Tensile Test

The tensile tests were performed using DAO-U01 (Dao Technology, Korea) to measure Young's moduli and stretchability of ionic PEGDA membranes and PEDOT:PSS film. The freestanding film and membranes were kept in an argon atmosphere for 6 h before the tensile measurements. Stress-strain data were recorded with 0.00027 strain per second of cross-head speed until the sample gets fractured. All the measurements were carried out under ambient conditions with relative humidity of 25%.

As described above, the new design for the multilayer iEAP actuator according to the present invention is suggested through the inspiration from plant roots responding to environmental stimuli and various motions (for example, elongation, linear growth, and bending) typically exhibited by skeletal muscles and mechanoreceptors. In view of the actuator inspired by nature, the multilayer iEAP actuator with the soft components is a prototype of a natural bilayer actuator so that the multilayer iEAP actuator can produce complex deformation and provide an innovative design.

While the present invention has been described with reference to the particular illustrative embodiments, it is not to be restricted by the embodiments but only by the appended claims. It is to be appreciated that those skilled in the art can change or modify the embodiments without departing from the scope and spirit of the present invention.

REFERENCE

1. McCracken, J. M., Donovan, B. R. & White, T. J. Materials as machines. Adv. Mater. 32, 1906564 (2020).
2. Chen, Y. et al. Controlled flight of a microrobot powered by soft artificial muscles. Nature 575, 324-329 (2019)
3. Skylar-Scott, M. A., Mueller, J., Visser, C. W. & Lewis, J. A. Voxelated soft matter via multimaterial multinozzle 3D printing. Nature 575, 330-335 (2019).
4. Cai, M., Nie, S., Du, Y., Wang, C. & Song, J. Soft elastomers with programmable stiffness as strain-isolating substrates for stretchable electronics. ACS Appl. Mater. Interfaces 11, 14340-14346 (2019).
5. Lee, S. et al. An ultrathin conformable vibration-responsive electronic skin for quantitative vocal recognition. Nat. Commun. 10, 2468 (2019).
6. Someya, T. & Amagai, M. Toward a new generation of smart skins. Nat. Biotechnol. 37, 382-388 (2019).
7. Cacucciolo, V. et al. Stretchable pumps for soft machines. Nature 572, 516-519 (2019).
8. Lee, Y. et al. Stretchable organic optoelectronic sensorimotor synapse. Sci. Adv. 4, eaat7387 (2018).
9. Kim, J. et al. Reducing the metabolic rate of walking and running with a versatile, portable exosuit. Science 365, 668-672 (2019).
10. Witte, K. A., Fiers, P., Sheets-Singer, A. L. & Collins, S. H. Improving the energy economy of human running with powered and unpowered ankle exoskeleton assistance. Sci. Robot. 5, 9108 (2020).
11. Moseley, P. et al. Modeling, design, and development of soft pneumatic actuators with finite element method. Adv. Eng. Mater. 18, 978-988 (2016).
12. Miriyev, A., Stack, K. & Lipson, H. Soft material for soft actuators. Nat. Commun. 8, 596 (2017).
13. Molla, M. R. et al. Dynamic actuation of glassy polymersomes through isomerization of a single azobenzene unit at the block copolymer interface. Nat. Chem. 10, 659-666 (2018).
14. Shahsavan, H., Salili, S. M., Jakli, A. & Zhao, B. Thermally active liquid crystal network gripper mimicking the self-peeling of gecko toe pads. Adv. Mater. 29, 1604021 (2017).
15. Preston, D. J. et al. A soft ring oscillator. Sci. Robot. 4, 5496 (2019).
16. Shang, J. & Theato, P. Smart composite hydrogel with pH-, ionic strength- and temperature-induced actuation. Soft Matter 14, 8401-8407 (2018).
17. Lin, H. et al. Programmable actuation of porous poly(ionic liquid) membranes by aligned carbon nanotubes. Adv. Mater. Interfaces 4, 1600768 (2017).
18. Kotal, M. et al. Highly bendable ionic soft actuator based on nitrogen-enriched 3D hetero-nanostructure electrode. Adv. Funct. Mater. 28, 1802464 (2018).
19. Roy, S. et al. Collectively exhaustive electrodes based on covalent organic framework and antagonistic co-doping for electroactive ionic artificial muscles. Adv. Funct. Mater. 29, 1900161 (2019).
20. Kim, O., Kim, H., Choi, U. H. & Park, M. J. One-volt-driven superfast polymer actuators based on single-ion conductors. Nat. Commun. 7, 13576 (2016).
21. Rajapaksha, C. P. H. et al. Poly(ethylene glycol) diacrylate based electro-active ionic elastomer. Macromol. Rapid Commun. 41, 1900636 (2020).
22. Cao, J., Rendon Piedrahita, C., Zhao, Z., Vogt, B. D. & Kyu, T. Tuning flexoelectric effect in polymer electrolyte membranes via cation selection for potential energy harvesting applications. ACS Appl. Energy Mater. 3, 328-335 (2019).
23. Kim, O., Kim, S. J. & Park, M. J. Low-voltage-driven soft actuators. Chem. Commun. 54, 4895-4904 (2018).
24. Meira, R. M. et al. Ionic-liquid-based electroactive polymer composites for muscle tissue engineering. ACS Appl. Polym. Mater. 1, 2649-2658 (2019).
25. Kim, S. J., Kim, O. & Park, M. J. True low-power self-locking soft actuators. Adv. Mater. 30, 1706547 (2018).
26. Kim, O., Shin, T. J. & Park, M. J. Fast low-voltage electroactive actuators using nanostructured polymer electrolytes. Nat. Commun. 4, 2208 (2013).
27. Kim, O., Kim, S. Y., Park, B., Hwang, W. & Park, M. J. Factors affecting electromechanical properties of ionic polymer actuators based on ionic liquid-containing sulfonated block copolymers. Macromolecules 47, 4357-4368 (2014).
28. Tabassian, R. et al. Graphene mesh for self-sensing ionic soft actuator inspired from mechanoreceptors in human body. Adv. Sci. 6, 1901711 (2019).
29. Qiu, Y., Zhang, E., Plamthottam, R. & Pei, Q. Dielectric elastomer artificial muscle: Materials innovations and device explorations. Acc. Chem. Res. 52, 316-325 (2019).
30. Youn, J.-H. et al. Dielectric elastomer actuator for soft robotics applications and challenges. App. Sci. 10, 640 (2020).
31. Oh, J. Y. et al. Effect of PEDOT nanofibril networks on the conductivity, flexibility, and coatability of PEDOT:PSS films. ACS Appl. Mater. Interfaces 6, 6954-6961 (2014).
32. Poulin, A., Rosset, S. & Shea, H. R. Printing low-voltage dielectric elastomer actuators. Appl. Phys. Lett. 107, 244104 (2015).
33. Tugui, C., Stiubianu, G. T., Serbulea, M. S. & Cazacu, M. Silicone dielectric elastomers optimized by cross-linking pattern—a simple approach to high-performance actuators. Polym. Chem. 11, 3271-3284 (2020).
34. Caspari, P., Dnki, S. J., Nesch, F. A. & Opris, D. M. Dielectric elastomer actuators with increased dielectric 35. Ji, X. et al. Stretchable composite monolayer electrodes for low voltage dielectric elastomer actuators. Sens. Actuators B Chem. 261, 135-143 (2018).
36. Ji, X. et al. An autonomous untethered fast soft robotic insect driven by low-voltage dielectric elastomer actuators. Sci. Robot. 4, eaaz6451 (2019).
37. Ree, B. J. et al. Phase transition behaviors and nanoscale film morphologies of poly(delta-valerolactone) axles bearing movable and fixed rotaxane wheels. Macromol. Rapid. Commun. 40, e1900334 (2019).
38. Taccola, S., Bellacicca, A., Milani, P., Beccai, L. & Greco, F. Low-voltage dielectric elastomer actuators with stretchable electrodes fabricated by supersonic cluster beam implantation. J. Appl. Phys. 124, 064901 (2018).
39. Tan, M. W. M., Thangavel, G. & Lee, P. S. Enhancing dynamic actuation performance of dielectric elastomer actuators by tuning viscoelastic effects with polar crosslinking. NPG Asia Mater. 11, 62 (2019).
40. Jung, H. S. et al. Design and fabrication of twisted monolithic dielectric elastomer actuator. Int. J. Control Autom. Syst. 15, 25-35 (2017).
41. Hau, S., Rizzello, G. & Seelecke, S. A novel dielectric elastomer membrane actuator concept for high-force applications. Extreme Mech. Lett. 23, 24-28 (2018).
42. Fannir, A. et al. Linear artificial muscle based on ionic electroactive polymer: A rational design for open-air and vacuum actuation. Adv. Mater. Technol. 4, 1800519 (2019).
43. Plesse, C., Vidal, F., Teyssie, D. & Chevrot, C. Conducting polymer artificial muscle fibres: Toward an open air linear actuation. Chem. Commun. 46, 2910-2912 (2010).
44. Bay, L., West, K., Sommer-Larsen, P., Skaarup, S. & Benslimane, M. A conducting polymer artificial muscle with 12% linear strain. Adv. Mater. 15, 310-313 (2003).
45. Hara, S., Zama, T., Takashima, W. & Kaneto, K. Polypyrrole-metal coil composite actuators as artificial muscle fibres. Synth. Met. 146, 47-55 (2004).
46. Smela, E. Conjugated polymer actuators for biomedical applications. Adv. Mater. 15, 481-494 (2003).
47. Peter, M. & Tayalia, P. An alternative technique for patterning cells on poly(ethylene glycol) diacrylate hydrogels. RSC Adv. 6, 40878-40885 (2016).
48. Rohtlaid, K.; Nguyen, G. T. M.; Ebrahimi-Takalloo, S.; Nguyen, T. N.; Madden, J. D. W.; Vidal, F.; Plesse, C. Asymmetric Pedot:Pss Trilayers as Actuating and Sensing Linear Artificial Muscles. *Adv. Mater. Technol.* 2021, 6, 2001063.
49. Kiefer, R.; Nguyen, N. T.; Le, Q. B.; Anbarjafari, G.; Tamm, T. Antagonist Concepts of Polypyrrole Actuators: Bending Hybrid Actuator and Mirrored Trilayer Linear Actuator. *Polymers* 2021, 13, 861.
50. Harjo, M.; Järvekülg, M.; Tamm, T.; Otero, T. F.; Kiefer, R. Concept of an Artificial Muscle Design on Polypyrrole Nanofiber Scaffolds. *PLoS ONE* 2020, 15, e0232851.

What is claimed is:

1. An actuator comprising:
a first ionic polymer layer disposed on underside of a first electrode layer;
a second ionic polymer layer disposed on top of a second electrode layer; and
a porous conducting interlayer disposed between the first ionic polymer layer and the second ionic polymer layer.

2. The actuator according to claim 1, driven at a low voltage.

3. The actuator according to claim 1, enabling a linear motion.

4. The actuator according to claim 1, enabling a linear motion in an ambient air.

5. The actuator according to claim 1, enabling a bending motion in an ambient air.

6. The actuator according to claim 1, wherein the first electrode layer, the second electrode layer, and the porous interlayer are connected to power sources for applying voltages thereto.

7. The actuator according to claim 1, wherein the first electrode layer and the second electrode layer are connected to a first pole power source, and the porous interlayer is connected to a counter pole power source to the first pole power source, so that through the application of the voltages, the linear motion is performed.

8. The actuator according to claim 1, wherein the first electrode layer is connected to a first pole power source, the second electrode layer is connected to a counter pole power source to the first pole power source, and the porous interlayer is shorted, so that bending motion is performed.

9. The actuator according to claim 1, wherein the first electrode layer is a first polymer electrode layer, the second electrode layer is a second polymer electrode layer, and the porous conducting interlayer is a porous conducting polymer interlayer.

10. The actuator according to claim 1, wherein the porous conducting interlayer is charged negatively or positively and stretches by intercalating counter ions into the first ionic polymer layer and the second ionic polymer layer.

11. The actuator according to claim 1, wherein the porous conducting interlayer is charged negatively or positively and shrinks by deintercalating counter ions from the first ionic polymer layer and the second ionic polymer layer.

12. The actuator according to claim 1, wherein the porous conducting interlayer is composed of a conducting polymer and a surfactant.

13. The actuator according to claim 1, wherein the porous conducting interlayer is composed of a poly(3, 4-ethylenedioxythiophene):poly(styrenesulfonate) (PEDOT:PSS) conducting polymer and a surfactant.

14. The actuator according to claim 1, wherein the porous conducting interlayer has a thickness of 5 to 50 micrometers.

15. The actuator according to claim 1, wherein the first ionic polymer layer and the second ionic polymer layer have the same polymer as each other.

16. The actuator according to claim 1, wherein the first ionic polymer layer contains lithium salts.

17. The actuator according to claim 1, wherein the second ionic polymer layer contains ionic liquid.

18. The actuator according to claim 1, wherein the first ionic polymer layer and the second ionic polymer layer contain the same anions as each other.

19. The actuator according to claim 1, wherein the first ionic polymer layer and the second ionic polymer layer have different thicknesses from each other.

20. The actuator according to claim 1, wherein the first electrode layer and the second electrode layer have the same polymer as each other.

21. The actuator according to claim 1, having a linear strain greater than or equal to 5% at a low voltage.

22. The actuator according to claim 1, operating flexibly according to directions of the voltage.

* * * * *